(12) United States Patent
Tanaka et al.

(10) Patent No.: US 11,776,632 B2
(45) Date of Patent: Oct. 3, 2023

(54) SEMICONDUCTOR MEMORY DEVICE

(71) Applicant: Kioxia Corporation, Tokyo (JP)

(72) Inventors: Reika Tanaka, Yokohama (JP);
Masumi Saitoh, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 205 days.

(21) Appl. No.: 17/447,594

(22) Filed: Sep. 14, 2021

(65) Prior Publication Data

US 2022/0310170 A1 Sep. 29, 2022

(30) Foreign Application Priority Data

Mar. 23, 2021 (JP) ................................. 2021-048564

(51) Int. Cl.
*G11C 16/26* (2006.01)
*G11C 16/14* (2006.01)
*G11C 16/10* (2006.01)
*G11C 5/06* (2006.01)
*G11C 16/30* (2006.01)

(52) U.S. Cl.
CPC ............ *G11C 16/14* (2013.01); *G11C 5/06* (2013.01); *G11C 16/102* (2013.01); *G11C 16/26* (2013.01); *G11C 16/30* (2013.01)

(58) Field of Classification Search
CPC ......... G11C 16/14; G11C 5/06; G11C 16/102; G11C 16/26; G11C 16/30; G11C 11/2259; G11C 11/2273; G11C 11/2275; G11C 5/025; G11C 11/223; H10B 51/20; H10B 51/40; H10B 53/00
See application file for complete search history.

(56) References Cited

U.S. PATENT DOCUMENTS

| 10,211,223 B2 | 2/2019 | Van Houdt et al. |
| 10,242,989 B2 | 3/2019 | Pandey et al. |
| 10,651,182 B2 | 5/2020 | Morris et al. |
| 10,868,042 B1* | 12/2020 | Zhang ............... H01L 29/40111 |
| 2021/0082956 A1* | 3/2021 | Suzuki .................. H10B 51/30 |

FOREIGN PATENT DOCUMENTS

| JP | 2019-057727 A | 4/2019 |
| JP | 2020-098844 A | 6/2020 |

\* cited by examiner

*Primary Examiner* — Xiaochun L Chen
(74) *Attorney, Agent, or Firm* — Oblon, McClelland, Maier & Neustadt, L.L.P.

(57) ABSTRACT

A semiconductor memory device includes a semiconductor layer, a gate electrode, a gate insulating film disposed therebetween, first and second wirings connected to the semiconductor layer, and a third wiring connected to the gate electrode and is configured to execute a write operation, an erase operation, and a read operation. In the write operation, a write voltage of a first polarity is supplied between the third wiring and at least one of the first wiring or the second wiring. In the erase operation, an erase voltage of a second polarity is supplied between the third wiring and at least one of the first wiring or the second wiring. In the read operation, the write voltage or a voltage having a larger amplitude than that of the write voltage is supplied between the third wiring and at least one of the first wiring or the second wiring.

14 Claims, 24 Drawing Sheets

SEMICONDUCTOR MEMORY DEVICE

CROSS-REFERENCE TO RELATED APPLICATIONS

This application is based upon and claims the benefit of Japanese Patent Application No. 2021-048564, filed on Mar. 23, 2021, the entire contents of which are incorporated herein by reference.

BACKGROUND

Field

Embodiments described herein relate generally to a semiconductor memory device.

Description of the Related Art

There has been known a semiconductor memory device including a plurality of memory transistors. The plurality of memory transistors have a gate insulating film that includes, for example, an insulating electric charge accumulating layer, such as silicon nitride ($Si_3N_4$), a conductive electric charge accumulating layer, such as a floating gate, and a memory unit that ensures storing data, such as a ferroelectric film.

DETAILED DESCRIPTION

Figure 1:
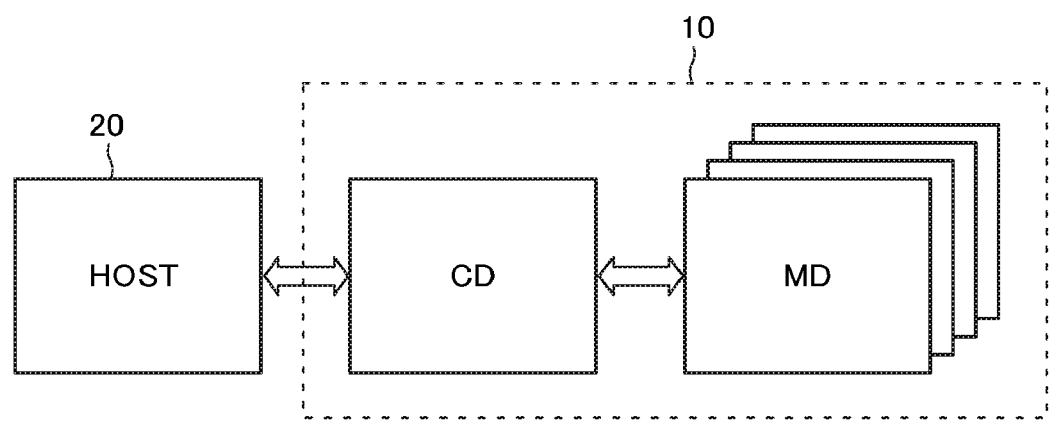
FIG. 1 is a schematic block diagram illustrating a configuration of a semiconductor memory device according to a first embodiment.

A semiconductor memory device according to one embodiment comprises a memory transistor and a plurality of wirings connected to the memory transistor. The memory transistor includes a semiconductor layer, agate electrode opposed to the semiconductor layer, and a gate insulating film disposed between the semiconductor layer and the gate insulating film. The plurality of wirings include a first wiring connected to the semiconductor layer; a second wiring connected to the semiconductor layer; and a third wiring connected to the gate electrode. The gate insulating film includes oxygen (O) and hafnium (Hf) and has an orthorhombic crystalline structure. This semiconductor memory device is configured to execute the write operation, the erase operation, and the first read operation. In the write operation, a write voltage in a first polarity is supplied between the third wiring and at least one of the first wiring or the second wiring. In the erase operation, an erase voltage in a second polarity is supplied between the third wiring and at least one of the first wiring or the second wiring. The second polarity is different from the first polarity. In the first read operation, a write voltage or a voltage having a larger amplitude than an amplitude of the write voltage in the first polarity is supplied between the third wiring and at least one of the first wiring or the second wiring.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of a memory system 10 according to a first embodiment.

The memory system 10, for example, reads, writes, and erases user data in response to a signal transmitted from a host computer 20. The memory system 10 is, for example, any system that can store the user data such as a memory chip, a memory card, an SSD or the like. The memory system 10 includes a plurality of memory dies MD that store the user data and a controller die CD connected to the plurality of memory dies MD and the host computer 20. The controller die CD includes, for example, a processor, a RAM, and the like, and performs conversion between a logical address and a physical address, bit error detection/correction, a garbage collection (compaction), a wear leveling, and the like.

Figure 2:
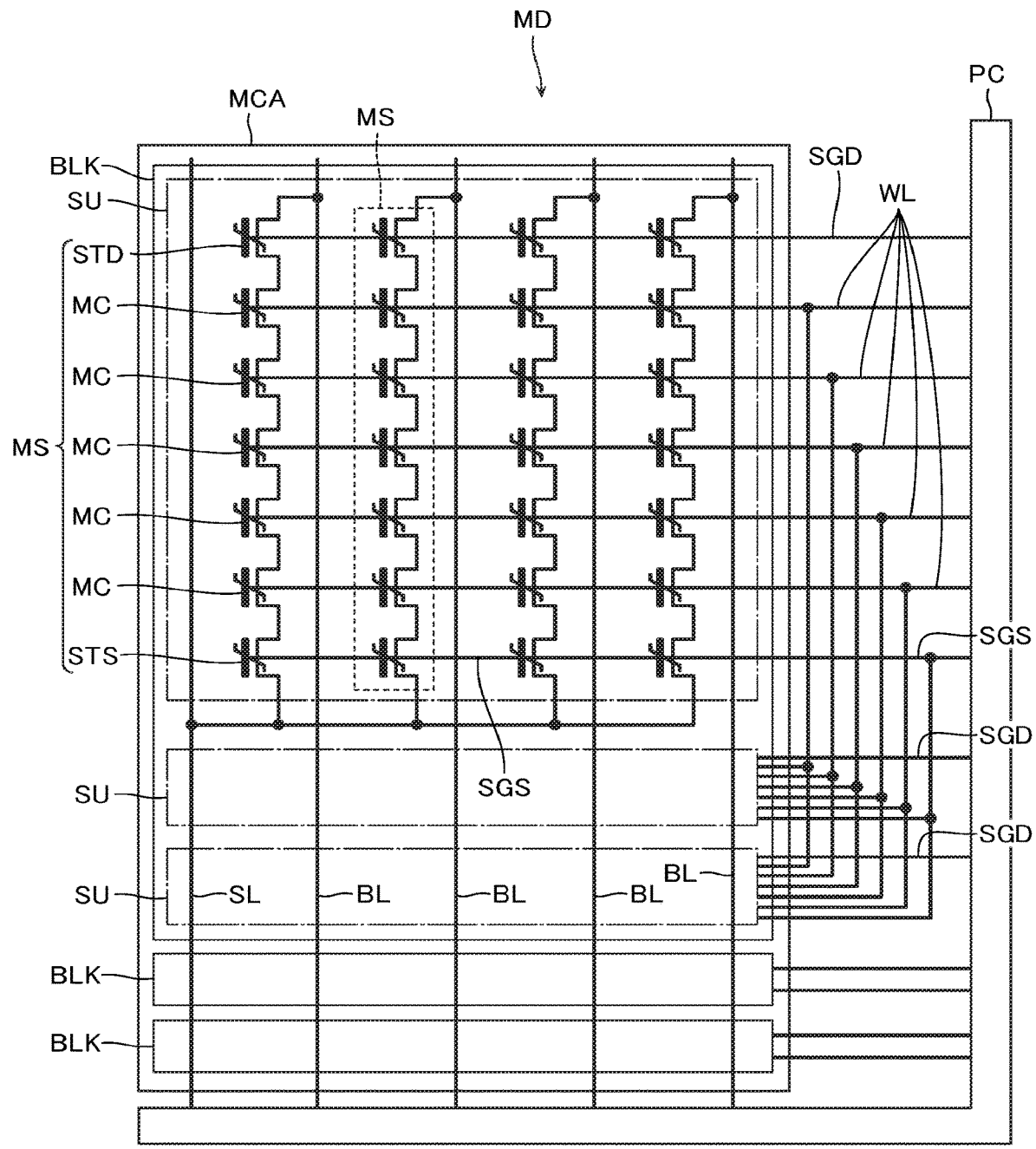
FIG. 2 is a schematic circuit diagram of the semiconductor memory device.

FIG. 2 is a schematic circuit diagram illustrating a configuration of a part of the memory die MD according to the first embodiment. As illustrated in FIG. 2, the memory die MD includes a memory cell array MCA that stores data and a peripheral circuit PC connected to the memory cell array MCA.

The memory cell array MCA includes a plurality of memory blocks BLK as illustrated in FIG. 2. The plurality of memory blocks BLK each include a plurality of string units SU. The plurality of string units SU each include a plurality of memory strings MS. The plurality of memory strings MS have one ends each connected to the peripheral circuit PC via a plurality of bit lines BL that are electrically independent. The plurality of memory strings MS have other ends each connected to the peripheral circuit PC via one source line SL electrically in common.

The memory string MS includes a drain-side select transistor STD, a plurality of memory cells MC (memory transistors), and a source-side select transistor STS, which are connected in series between the bit line BL and the source line SL. Hereinafter, the drain-side select transistor STD and the source-side select transistor STS may be simply referred to as select transistors (STD, STS).

The memory cell MC is a field-effect type transistor including a semiconductor layer that functions as a channel region, a gate insulating film including a memory unit, and a gate electrode. The memory cell MC has a threshold voltage that changes according to a state of the memory unit. The memory cell MC stores one bit or a plurality of bits of data. Word lines WL are connected to the respective gate electrodes of the plurality of memory cells MC corresponding to one memory string MS. These respective word lines WL are connected in common to all of the memory strings MS in one memory block BLK.

The select transistors (STD, STS) are field-effect type transistors each including a semiconductor layer that functions as a channel region, a gate insulating film, and a gate electrode. Select gate lines (SGD, SGS) are connected to the respective gate electrodes of the select transistors (STD, STS). The drain-side select gate line SGD is disposed corresponding to the string unit SU and is connected in common to all of the memory strings MS in one string unit SU. The source-side select gate line SGS is connected in common to all of the memory strings MS in the plurality of string units SU.

For example, the peripheral circuit PC includes a voltage generation circuit that generates operating voltages and outputs it to voltage supply lines, a decode circuit that electrically conducts desired voltage supply lines with the bit lines BL, the source lines SL, the word lines WL, and the select gate lines (SGD, SGS), a sense amplifier circuit that senses currents or voltages of the bit lines BL, and a sequencer that controls these circuits.

Figure 3:
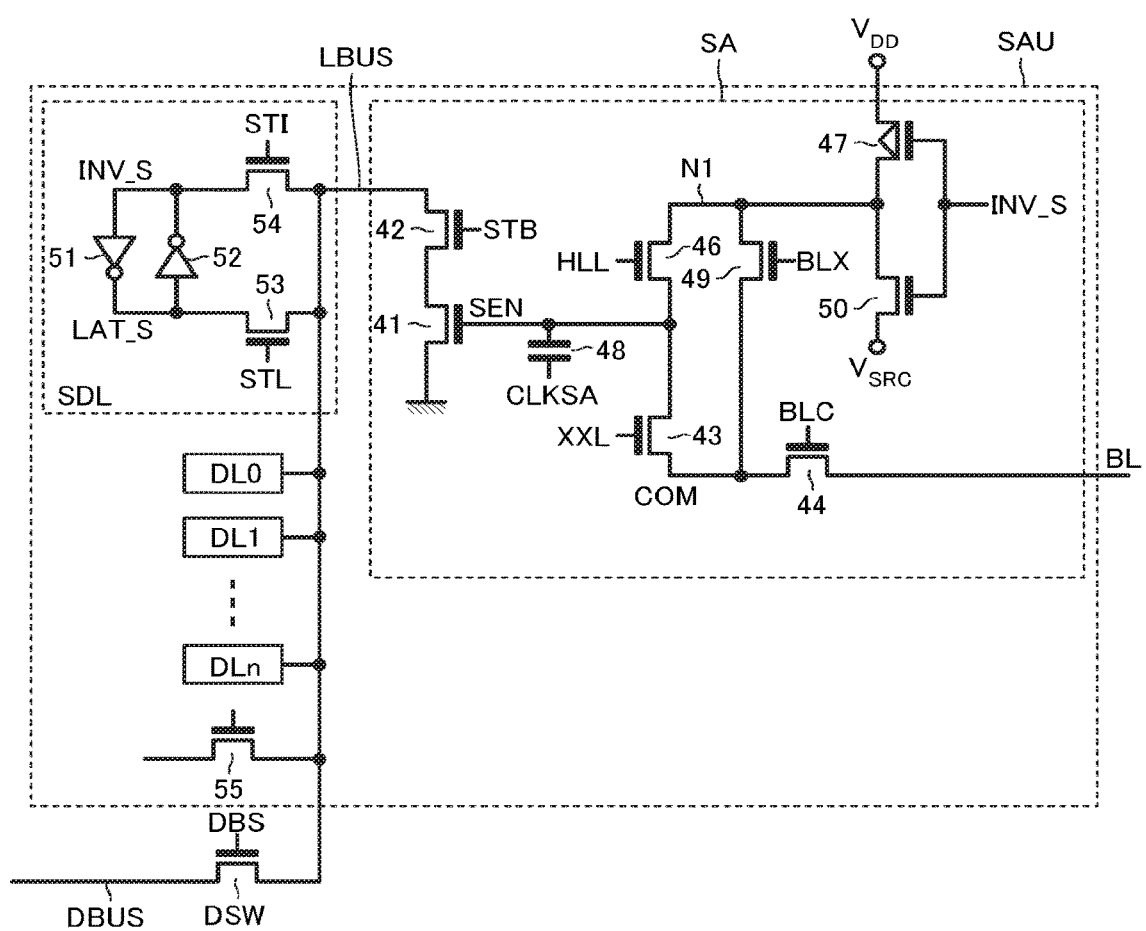
FIG. 3 is a schematic circuit diagram of the semiconductor memory device.

FIG. 3 is a schematic circuit diagram illustrating a configuration of a part of the peripheral circuit PC. FIG. 3 illustrates a sense amplifier unit SAU electrically connected to the bit line BL.

The sense amplifier unit SAU includes a sense amplifier SA, a data wiring LBUS, and latch circuits SDL, DL0 to DLn (n is a natural number). The data wiring LBUS is connected to a charge transistor 55 for precharging. The data wiring LBUS is connected to the data wiring DBUS via a switch transistor DSW.

The sense amplifier SA includes a sense transistor 41. The sense transistor 41 discharges an electric charge of the data wiring LBUS corresponding to a current that flows in the bit line BL. The sense transistor 41 has a source electrode connected to a voltage supply line to which a ground voltage $V_{SS}$ is supplied. A drain electrode is connected to the data wiring LBUS via a switch transistor 42. The gate electrode is connected to the bit line BL via a sense node SEN, a discharge transistor 43, a node COM, and a clamp transistor 44. Note that the sense node SEN is connected to a signal line CLKSA via a capacitor 48.

The sense amplifier SA includes a voltage transfer circuit. The voltage transfer circuit selectively electrically conducts the node COM and the sense node SEN with a voltage supply line to which a voltage $V_{DD}$ is supplied or a voltage supply line to which a voltage $V_{SRC}$ is supplied in accordance with data latched by the latch circuit SDL. The voltage transfer circuit includes a node N1, a charge transistor 46, a charge transistor 49, a charge transistor 47, and a discharge transistor 50. The charge transistor 46 is connected between the node N1 and the sense node SEN. The charge transistor 49 is connected between the node N1 and the node COM. The charge transistor 47 is connected between the node N1 and the voltage supply line to which the voltage $V_{DD}$ is supplied. The discharge transistor 50 is connected between the node N1 and the voltage supply line to which the voltage $V_{SRC}$ is supplied. Note that the gate electrodes of the charge transistor 47 and the discharge transistor 50 are connected to a node INV_S of the latch circuit SDL in common.

Note that the sense transistor 41, the switch transistor 42, the discharge transistor 43, the clamp transistor 44, the charge transistor 46, the charge transistor 49, and the discharge transistor 50 are, for example, an enhancement type NMOS transistor. The charge transistor 47 is, for example, a PMOS transistor.

A gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the charge transistor 46 is connected to a signal line HLL. A gate electrode of the charge transistor 49 is connected to a signal line BLX. These signal lines STB, XXL, BLC, HLL, and BLX are connected to the sequencer (not illustrated).

the latch circuit SDL includes nodes LAT_S, INV_S, an inverter 51, an inverter 52, a switch transistor 53, and a switch transistor 54. The inverter 51 includes an output terminal connected to the node LAT_S and an input terminal connected to the node INV_S. The inverter 52 includes an input terminal connected to the node LAT_S and an output terminal connected to the node INV_S. The switch transistor 53 is disposed in a current path between the node LAT_S and the data wiring LBUS. The switch transistor 54 is disposed in a current path between the node INV_S and the data wiring LBUS. The switch transistors 53, 54 are, for example, an NMOS transistor. The switch transistor 53 has a gate electrode connected to a sequencer (not illustrated) via a signal line STL. The switch transistor 54 has a gate electrode connected to a sequencer (not illustrated) via a signal line STI.

The latch circuits DL0 to DLn are configured approximately the same as the latch circuit SDL. However, as described above, the node INV_S of the latch circuit SDL is electrically conducted with the gate electrodes of the charge transistor 47 and the discharge transistor 50 in the sense amplifier SA. The latch circuits DL0 to DLn are different from the latch circuit SDL in this respect.

The switch transistor DSW is, for example, an NMOS transistor. The switch transistor DSW is connected between the data wiring LBUS and the data wiring DBUS. The switch transistor DSW has a gate electrode connected to a sequencer (not illustrated) via the signal line DBS.

[Structure of Memory Die MD]

Figure 4:
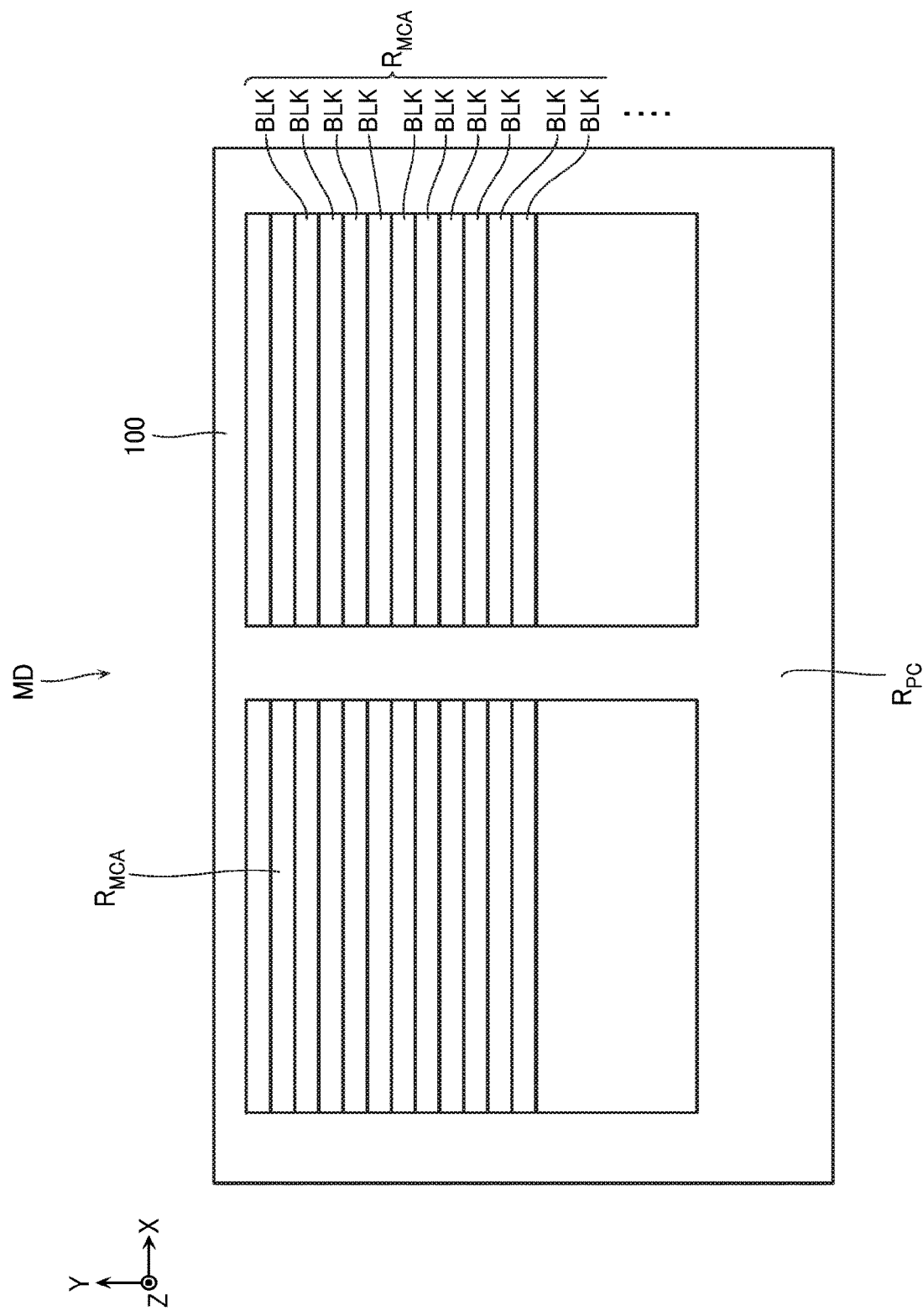
FIG. 4 is a schematic plan view of the semiconductor memory device.

FIG. 4 is a schematic plan view of the memory die MD. As illustrated in FIG. 4, the memory die MD includes a semiconductor substrate 100. In the illustrated example, the semiconductor substrate 100 includes two memory cell array regions $R_{MCA}$ arranged in the X-direction. The memory cell array region $R_{MCA}$ includes the plurality of memory blocks BLK arranged in the Y-direction. The semiconductor substrate 100 has an end portion in the Y-direction on which a peripheral circuit region $R_{PC}$ is disposed.

Figure 5:
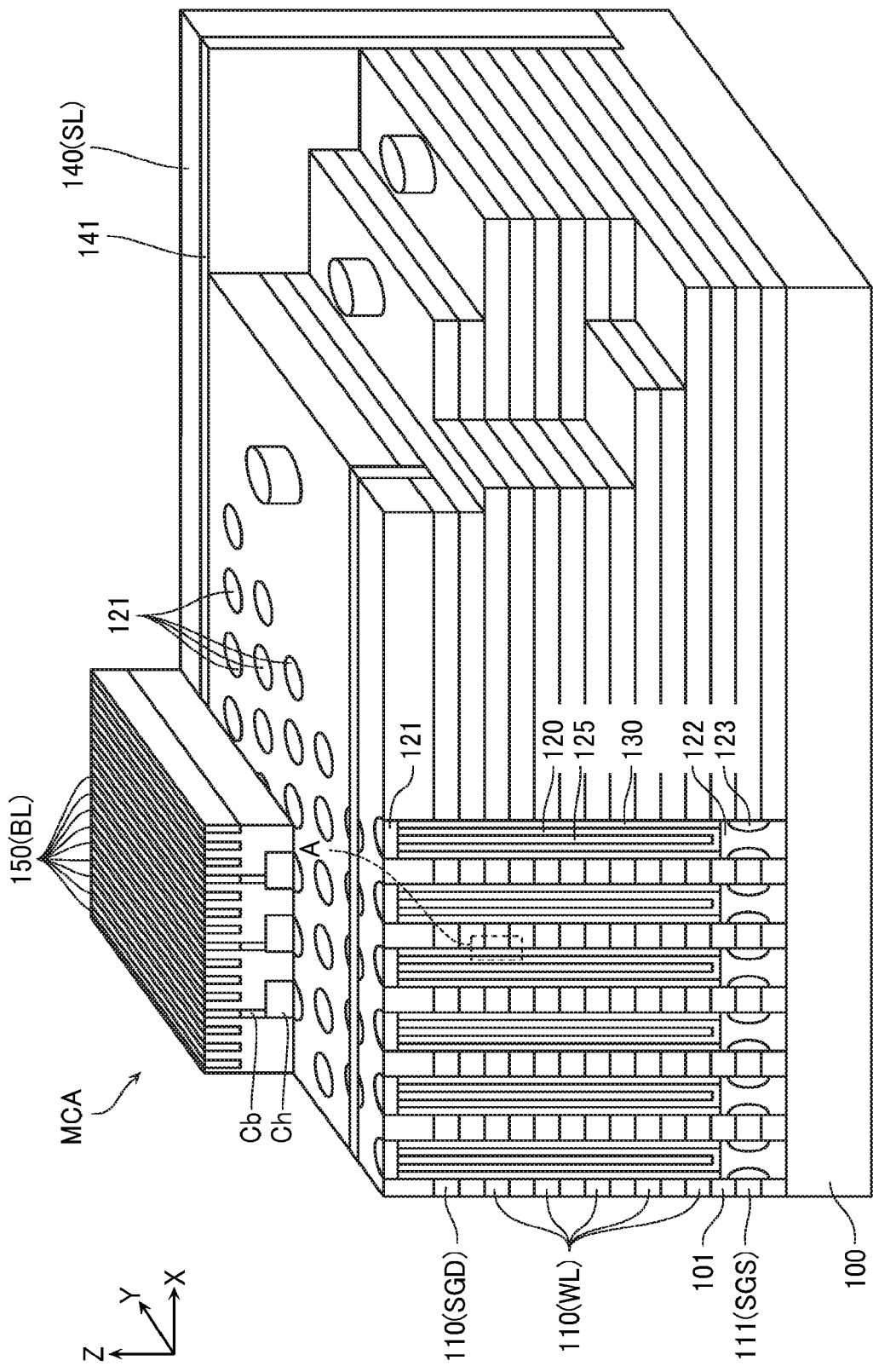
FIG. 5 is a schematic perspective view of the semiconductor memory device.
Figure 6:
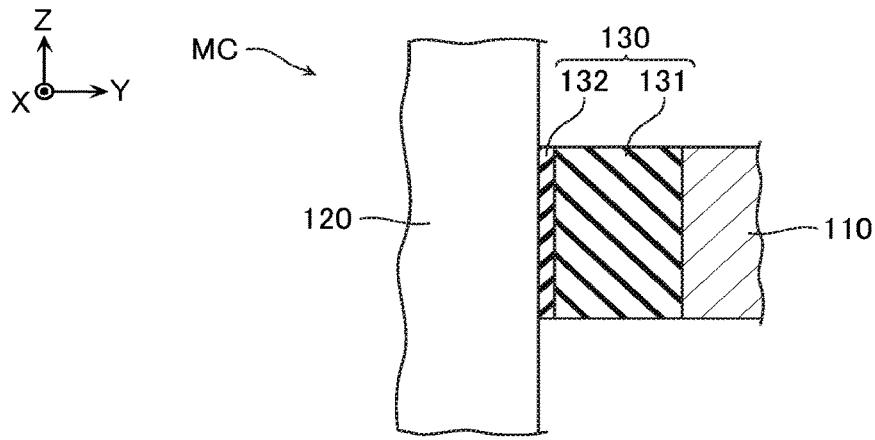
FIG. 6 is a schematic cross-sectional view of the semiconductor memory device.

FIG. 5 is a schematic perspective view illustrating a configuration of a part of the memory die MD. FIG. 6 is a schematic cross-sectional view illustrating a part indicated by A in FIG. 5 in an enlarged view.

As illustrated in FIG. 5, the memory die MD according to the embodiment includes a plurality of conductive layers 110 arranged in the Z-direction above the semiconductor substrate 100, a plurality of semiconductor layers 120 extending in the Z-direction, a plurality of gate insulating films 130 disposed between the plurality of respective conductive layers 110 and the plurality of respective semiconductor layers 120, a conductive layer 140 connected to the semiconductor substrate 100, and a conductive layer 150 disposed above these configurations.

The semiconductor substrate 100 is, for example, a semiconductor substrate of P-type silicon (Si) containing P-type impurities, such as boron (B). For example, in the surface of the semiconductor substrate 100, an N-type well region containing N-type impurities, such as phosphorus (P), a P-type well region containing P-type impurities, such as boron (B), and a semiconductor substrate region where the N-type well region or the P-type well region is not disposed are disposed. The N-type well region, the P-type well region, and the semiconductor substrate region each function as a part of a plurality of the transistors, a plurality of capacitors, and the like constituting the peripheral circuit PC.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101, such as silicon oxide ($SiO_2$), are disposed. A part of the conductive layers 110 each function as the word lines WL (FIG. 2) and the gate electrodes of the plurality of memory cells MC (FIG. 2) connected to these. A part of the conductive layers 110 each function as the drain-side select gate line SGD (FIG. 2) and the gate electrodes of the plurality of drain-side select transistors STD (FIG. 2) connected to this.

A conductive layer 111 is disposed below the conductive layers 110. The conductive layer 111 may include, for example, a stacked film of a barrier conductive film, such as titanium nitride (TiN), and a metal film, such as tungsten (W), or the like. Between the conductive layer 111 and the conductive layer 110, the insulating layer 101, such as silicon oxide ($SiO_2$), is disposed.

The semiconductor layers 120 are arranged in the X-direction and the Y-direction in a predetermined pattern. The semiconductor layer 120 functions as the channel regions of the plurality of memory cells MC and the select transistors (STD, STS) included in one memory string MS (FIG. 2). The semiconductor layer 120 is, for example, a semiconductor layer, such as polycrystalline silicon (Si). The semiconductor layer 120 has a substantially closed-bottomed cylindrical shape and includes an insulating layer 125, such as silicon oxide, in the center part. The semiconductor layer 120 has an outer peripheral surface that is surrounded by each of the conductive layers 110, and is opposed to the conductive layers 110.

The semiconductor layers 120 have upper end portions where impurity regions 121 containing N-type impurities, such as phosphorus (P), are disposed. The impurity regions 121 are connected to the bit lines BL via contacts Ch and contacts Cb.

The semiconductor layers 120 have lower end portions connected to a P-type well region of the semiconductor substrate 100 via semiconductor layers 122 formed of single-crystal silicon (Si) and the like. The semiconductor layer 122 functions as a channel region of the source-side select transistor STS. The semiconductor layer 122 has an outer peripheral surface that is surrounded by the conductive layer 111, and is opposed to the conductive layer 111. Between the semiconductor layer 122 and the conductive layer 111, an insulating layer 123, such as silicon oxide, is disposed.

The gate insulating film 130 has a substantially cylindrical shape that covers the outer peripheral surface of the semiconductor layer 120. For example, as illustrated in FIG. 6, the gate insulating film 130 includes a ferroelectric film 131 disposed between the conductive layer 110 and the semiconductor layer 120 and an insulating film 132 disposed between the ferroelectric film 131 and the semiconductor layer 120. The insulating film 132 is made of, for example, silicon oxide ($SiO_2$).

The ferroelectric film 131 may contain, for example, orthorhombic hafnium oxide. The hafnium oxide contained in the ferroelectric film 131 may mainly contain orthorhombic crystals. More specifically, the hafnium oxide contained in the ferroelectric film 131 may mainly contain a third orthorhombic crystal (orthorhombic III (space group Pbc21, space group number 29). Among crystals in the hafnium oxide contained in the ferroelectric film 131, a proportion of the orthorhombic crystals may be the largest.

The ferroelectric film 131 can contain at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

From the aspect of causing the hafnium oxide to exhibit ferroelectricity, a concentration of the additive element is preferably from 0.1 atomic percent or more and 60 atomic percent or less. The appropriate range of the concentration of the additive element to cause the hafnium oxide to exhibit the ferroelectricity differs depending on the kind of the additive element. For example, in the case of the additive element being silicon (Si), the appropriate range of the concentration of the additive element to exhibit the ferroelectricity is from 3 atomic percent or more to 7 atomic percent or less. For example, in the case of the additive element being barium (Ba), the appropriate range of the concentration of the additive element to exhibit the ferroelectricity is from 0.1 atomic percent or more to 3 atomic percent or less. For example, in the case of the additive element being zirconium (Zr), the appropriate range of the concentration of the additive element to exhibit the ferroelectricity is from 10 atomic percent or more to 60 atomic percent or less.

For example, as illustrated in FIG. 5, the conductive layer 140 extends in the Z-direction and the X-direction. The conductive layer 140 is connected to an N-type impurity region disposed in the P-type well region of the semiconductor substrate 100. The conductive layer 140 may include a stacked film of a barrier conductive film, such as titanium nitride (TiN), and a metal film, such as tungsten (W), or the like. The conductive layer 140, for example, functions as a part of the source line SL (FIG. 2). On side surfaces of the conductive layer 140 in the Y-direction, insulating layers 141, such as silicon oxide ($SiO_2$), are disposed.

The conductive layer 150 is arranged in the X-direction and extends in the Y-direction. The conductive layer 150 may include a stacked film of a barrier conductive film, such as titanium nitride (TiN), and a metal film, such as copper (Cu), or the like. The conductive layer 150, for example, functions as the bit line BL (FIG. 2).

[Threshold Voltage of Memory Cell MC]

Figure 7:
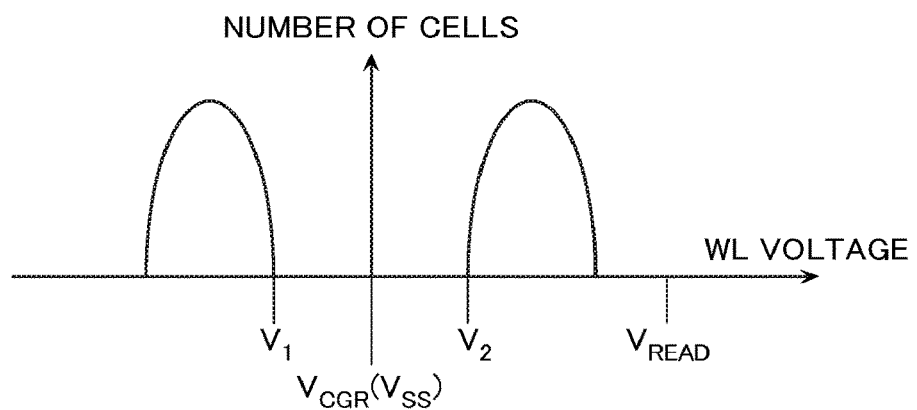
FIG. 7 is a schematic histogram for describing a threshold voltage of memory cells MC.

Next, with reference to FIG. 7, the threshold voltage of the memory cell MC is described. FIG. 7 is a schematic histogram describing the threshold voltages of the memory cells MC. The horizontal axis indicates the voltage of the word line WL and the vertical axis indicates the number of the memory cells MC. Note that the threshold voltage here is a threshold voltage when the memory cell MC is operated as an NMOS transistor.

In the example of FIG. 7, the threshold voltages of the memory cells MC are controlled to be in two patterns of states. For example, the threshold voltages of the memory cells MC controlled to be in a lower state has negative polarity, and these threshold voltages have absolute values larger than an absolute value of a voltage $V_1$ in negative polarity in FIG. 7. The threshold voltages of the memory cells MC controlled to be in an upper state has positive polarity, and these threshold voltages have absolute values larger than an absolute value of a voltage $V_2$ in positive polarity in FIG. 7.

In the read operation, for example, a read voltage $V_{CGR}$ between the voltage $V_1$ in negative polarity and the voltage $V_2$ in positive polarity is supplied to a selected word line WL. In the example of FIG. 7, the read voltage $V_{CGR}$ has a magnitude around the ground voltage $V_{SS}$. Accordingly, in channel regions of selected memory cells MC controlled to be in the lower state, electron channels are formed, and in channel regions of selected memory cells MC controlled to be in the upper state, channels are not formed.

In the read operation, for example, a read pass voltage $V_{READ}$ larger than the threshold voltages of the memory cells MC controlled to be in the upper state is supplied to unselected word lines WL. Accordingly, the unselected memory cells MC enter the ON state regardless of stored data. Accordingly, the selected memory cells MC are electrically conducted with the bit lines BL (FIG. 2) and the source line SL (FIG. 2). Therefore, when a voltage is supplied between the bit line BL and the source line SL in this state and it is detected whether a current flows through the bit line BL or not, the data stored in the selected memory cell MC can be read.

Figure 8:
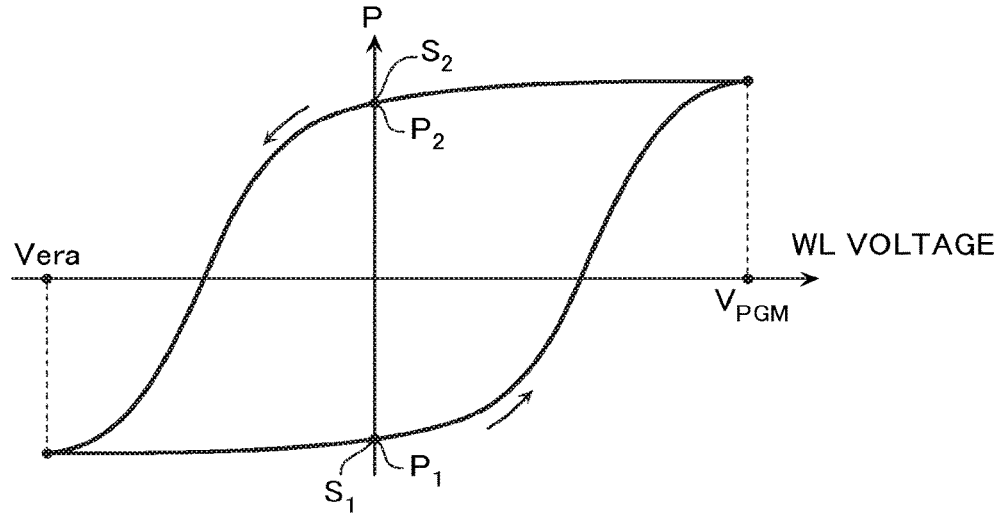
FIG. 8 is a schematic graph for describing polarizability of the memory cell MC.
Figure 9:
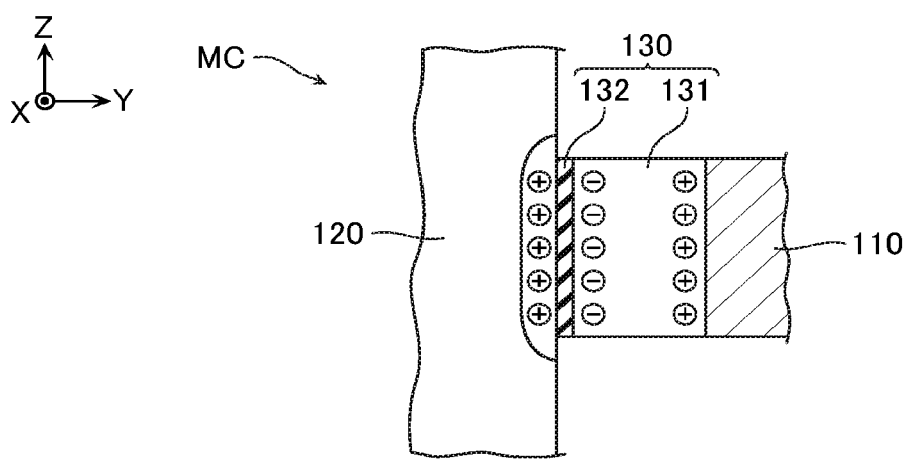
FIG. 9 is a schematic cross-sectional view for describing a state of the memory cell MC.
Figure 10:
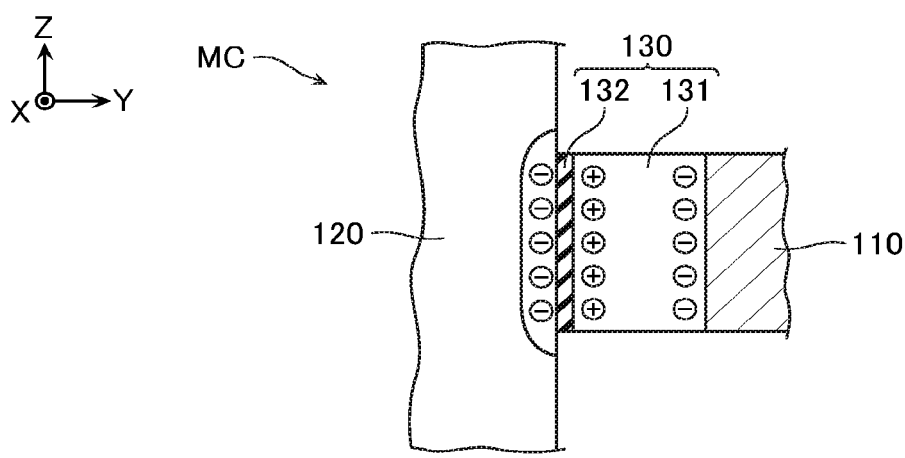
FIG. 10 is a schematic cross-sectional view for describing a state of the memory cell MC.

Next, with reference to FIG. 8 to FIG. 10, a control method of the threshold voltage of the memory cell MC is described. FIG. 8 is a schematic graph describing polarizability of the memory cell MC. The horizontal axis of the graph illustrated in FIG. 8 indicates the voltage of the word line WL. The vertical axis of the graph illustrated in FIG. 8 indicates polarizability P of the ferroelectric film 131. FIG. 9 and FIG. 10 are schematic cross-sectional views describing the state of the memory cell MC.

As described with reference to FIG. 6, the gate insulating film 130 of the memory cell MC according to the embodiment includes the ferroelectric film 131. When a voltage of positive polarity and a voltage of negative polarity having magnitudes equal to or more than a predetermined magnitude are supplied to the word line WL connected to the memory cell MC in alternation, the hysteresis curve as illustrated in FIG. 8 is observed. FIG. 8 indicates states $S_1$, $S_2$ on this hysteresis curve.

The state $S_1$ is the state of the memory cell MC controlled to be the upper state. The polarizability P of the state $S_1$ is negative polarizability $P_1$ and the voltage of the word line WL is in the state of the ground voltage $V_{SS}$. In the state, as illustrated in FIG. 9, a negative electric charge is induced to the surface on the semiconductor layer 120 side of the ferroelectric film 131. In the state, since a positive electric charge is induced to the semiconductor layer 120, an electron channel is less likely to be formed in the semiconductor layer 120. Accordingly, the threshold voltage of the memory cell MC becomes a positive value.

When a voltage having a magnitude around the read pass voltage is supplied to the gate electrode of the memory cell MC in the state $S_1$, the state of polarization in the ferroelectric film 131 does not change. When the supply of the voltage to the gate electrode is halted in the state, the memory cell MC returns to the state $S_1$.

When a voltage of positive polarity having a magnitude equal to or more than the predetermined magnitude is supplied to the gate electrode of the memory cell MC in the state $S_1$, the direction of the polarization in the ferroelectric film 131 is inverted because of an electric field between the conductive layer 110 and the semiconductor layer 120, and as illustrated in FIG. 8, the polarizability P in the ferroelectric film 131 increases. When the voltage of the gate electrode reaches a write voltage $V_{PGM}$, the polarizability P of the memory cell MC changes up to a certain magnitude and saturates. In a case where the supply of the voltage to the gate electrode is halted in the state, the memory cell MC transitions to the state $S_2$.

The state $S_2$ is the state of the memory cell MC controlled to be the lower state. The polarizability P of the state $S_2$ is positive polarizability $P_2$, and the voltage of the word line WL is in the state of the ground voltage $V_{SS}$. In the state, as illustrated in FIG. 10, a positive electric charge is induced to the surface on the semiconductor layer 120 side of the ferroelectric film 131. In the state, a negative electric charge is induced to the semiconductor layer 120. That is, the electron channel is formed in the semiconductor layer 120. Therefore, the threshold voltage of the memory cell MC becomes a negative value.

When a voltage of negative polarity having a magnitude equal to or more than the predetermined magnitude is supplied to the gate electrode of the memory cell MC in the state $S_2$, the direction of the polarization in the ferroelectric film 131 is inverted because of an electric field between the conductive layer 110 and the semiconductor layer 120, and as illustrated in FIG. 8, the polarizability P in the ferroelectric film 131 decreases. When the voltage of the gate electrode reaches an erase voltage $V_{era}$, the polarizability P of the memory cell MC changes up to a certain magnitude and saturates. In a case where the supply of the voltage to the gate electrode is halted in the state, the memory cell MC transitions to the state $S_1$.

[Read Operation]

Figure 11:
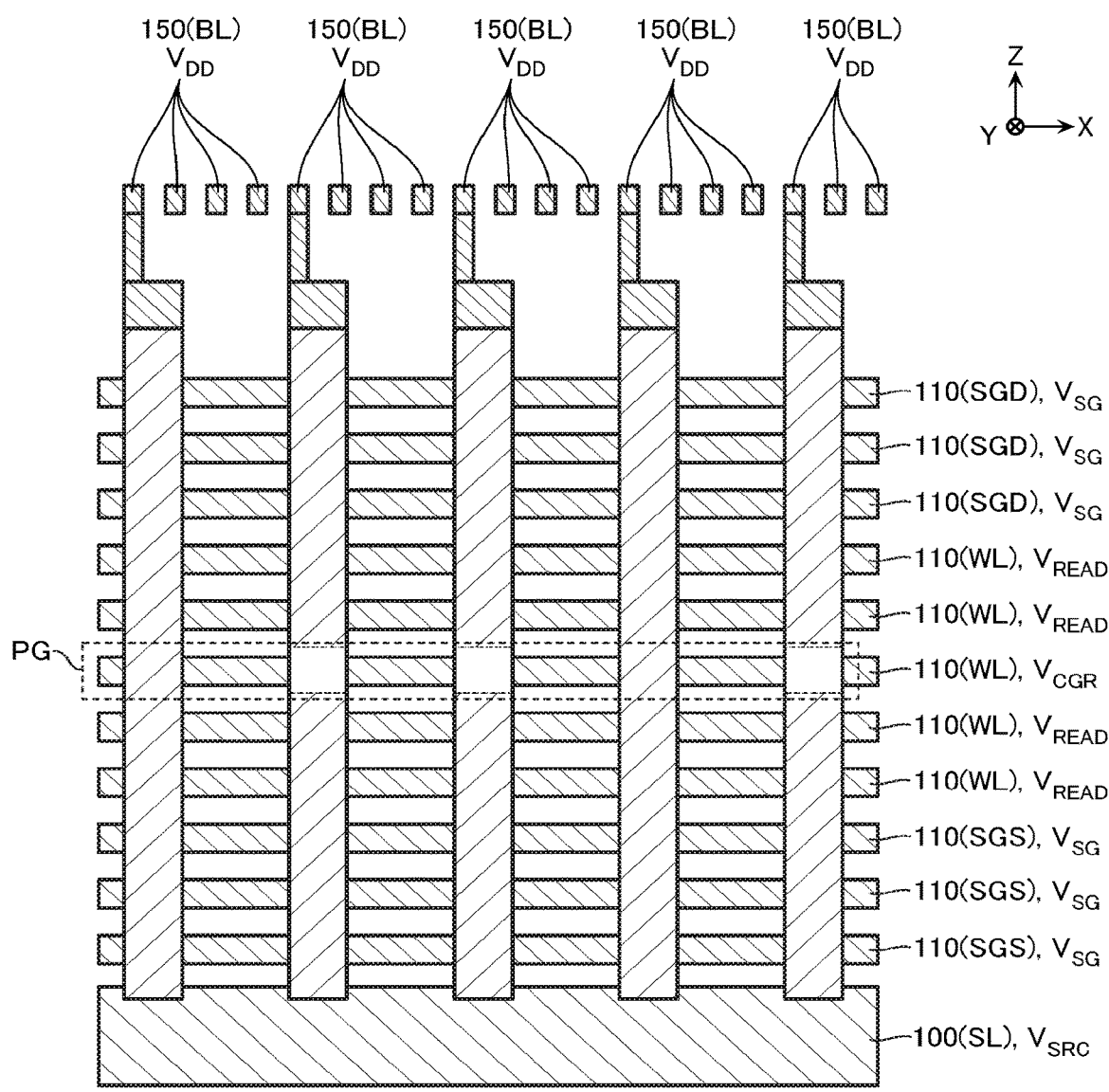
FIG. 11 is a schematic cross-sectional view for describing a read operation.

Next, with reference to FIG. 11, the read operation of the semiconductor memory device according to the embodiment is more specifically described. FIG. 11 is a schematic cross-sectional view describing the read operation.

Note that, in the following description, the configuration including all memory cells MC included in one string unit SU and connected to one word line WL is referred to as a page PG in some cases. In FIG. 11, an example where data is collectively read out from one page PG will be described.

In the read operation, for example, a voltage $V_{DD}$ is supplied to the bit lines BL and a voltage $V_{SRC}$ is supplied to the source line SL. For example, the voltage $V_{SRC}$ has a magnitude around the ground voltage $V_{SS}$. For example, the voltage $V_{SRC}$ is larger than the ground voltage $V_{SS}$ and smaller than the voltage $V_{DD}$. The voltage $V_{DD}$ is, for example, larger than the ground voltage $V_{SS}$.

The plurality of memory cells MC connected to the selected word line WL are electrically conducted with the bit lines BL and the source line SL. For example, a voltage $V_{SG}$ is supplied to the select gate lines (SGD, SGS). The difference between the voltage $V_{SG}$ and the voltage $V_{DD}$ is larger than the threshold voltage when the select transistors (STD, STS) are operated as the NMOS transistor. Accordingly, in the channel regions of the select transistors (STD, STS), electron channels are formed. The read pass voltage $V_{READ}$ is supplied to the unselected word lines WL. This forms electron channels in the channel regions of the unselected memory cells MC.

The read voltage $V_{CGR}$ is supplied to the selected word line WL. Thus, in channel regions of the memory cells MC corresponding to the lower state, electron channels are formed and in channel regions of the memory cells MC corresponding to the upper state, channels are not formed.

The sense amplifier unit SAU (FIG. 3) in the peripheral circuit PC executes a sense operation.

In the sense operation, for example, in the sense amplifier unit SAU described with reference to FIG. 3, the charge transistors 46, 47 are set to the ON state to charge the sense node SEN. Next, the charge transistor 46 is set to the OFF state. Next, the charge transistor 49 is set to the OFF state to separate the bit line BL from the voltage supply line. Next, the discharge transistor 43 and the clamp transistor 44 are set to the ON state to electrically conduct the sense node SEN with the bit line BL. Here, when the sense node SEN is connected to the selected memory cell MC in the ON state, the electric charge of the sense node SEN is discharged and the voltage of the sense node SEN is lowered. This causes the sense transistor 41 to enter the OFF state. On the other hand, when the sense node SEN is connected to the selected memory cell MC in the OFF state, the electric charge of the sense node SEN is not discharged and the voltage of the sense node SEN is not lowered. Accordingly, the sense transistor 41 is turned ON.

In the sense operation, for example, the charge transistor 55 is set to the ON state to charge the data wiring LBUS. Next, the charge transistor 55 is set to the OFF state. Next, the switch transistor 42 is set to the ON state. Here, when the data wiring LBUS is connected to the sense transistor 41 in the ON state, the electric charge of the data wiring LBUS is discharged. On the other hand, when the data wiring LBUS is connected to the sense transistor 41 in the OFF state, the electric charge of the data wiring LBUS is not discharged. Next, any one of the plurality of latch circuits SDL, DL0, DL1 . . . DLn connected to the data wiring LBUS latches the data of the data wiring LBUS as read data.

Afterwards, the latched read data is output to the controller die CD (FIG. 1). The controller die CD performs bit error detection/correction or the like on this read data and then transfers the data to the host computer 20 (FIG. 1).

Note that, in the above description, the example in which the data is collectively read out from all of the memory cells MC included in one page PG in the read operation has been described. However, in the read operation, the data may be read out only from one memory cell MC or the data may be collectively read out only from a part of the memory cells MC included in one page PG. In this case, for example, the voltage $V_{DD}$ may be supplied to the bit line BL connected to the memory cell MC as a target for the read operation, and the voltage $V_{SRC}$ may be supplied to the other bit lines BL.

[Write Operation]

Figure 12:
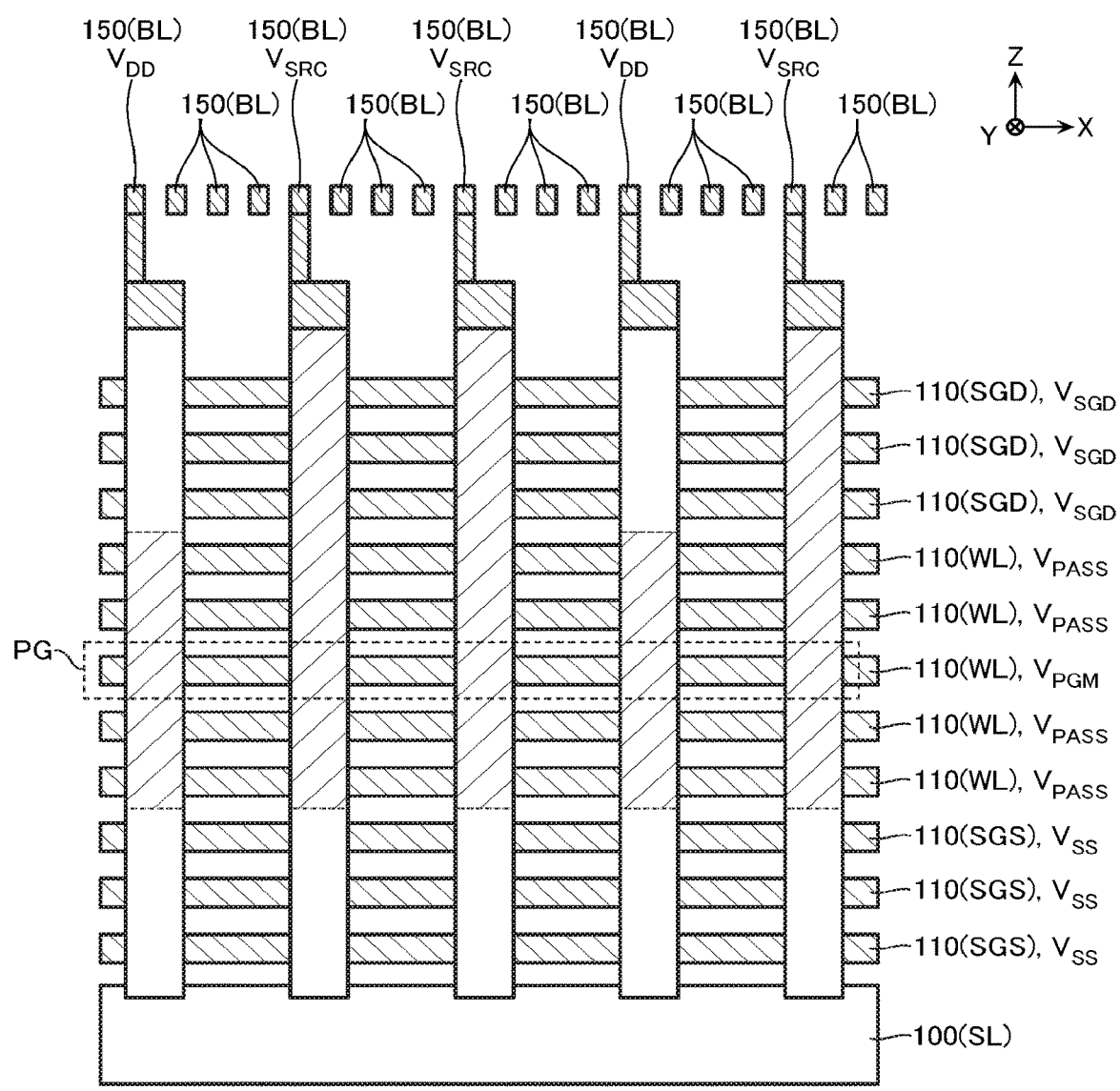
FIG. 12 is a schematic cross-sectional view for describing a write operation.

Next, the write operation will be described with reference to FIG. 12. FIG. 12 is a schematic cross-sectional view for describing the write operation.

FIG. 12 describes the example where data is collectively written in one page PG.

In the write operation, for example, the voltage $V_{SRC}$ is supplied to bit lines BL connected to the selected memory cells MC whose threshold voltages are adjusted (hereinafter referred to as a "write memory cell MC") and the voltage $V_{DD}$ is supplied to bit lines BL connected to the selected memory cells MC whose threshold voltages are not adjusted (hereinafter referred to as an "inhibit memory cell MC". For example, the latch circuits SDL (FIG. 3) corresponding to the write memory cells MC are caused to latch "0" to electrically conduct the bit lines BL corresponding to these with the voltage supply line that supplies the voltage $V_{SRC}$. The latch circuits SDL (FIG. 3) corresponding to the inhibit memory cells MC are caused to latch "1" to electrically conduct the bit lines BL corresponding to these with the voltage supply line that supplies the voltage $V_{DD}$.

The write memory cells MC are electrically conducted with the bit lines BL in a selective manner. For example, the voltage $V_{SGD}$ is supplied to the drain-side select gate line SGD. The voltage $V_{SGD}$ is, for example, smaller than the voltage $V_{SG}$ in FIG. 11.

The difference between the voltage $V_{SGD}$ and the voltage $V_{SRC}$ is larger than the threshold voltage when the select transistor (STD, STS) is operated as the NMOS transistor. Accordingly, in the channel regions of the drain-side select transistors STD connected to the bit lines BL to which the voltage $V_{SRC}$ is supplied, electron channels are formed.

On the other hand, the difference between the voltage $V_{SGD}$ and the voltage $V_{DD}$ is smaller than the threshold voltage when the select transistor (STD, STS) is operated as the NMOS transistor. Accordingly, in the channel regions of the drain-side select transistors STD connected to the bit lines BL to which the voltage $V_{DD}$ is supplied, channels are not formed.

The memory cells MC are electrically separated from the source line SL. For example, the ground voltage $V_{SS}$ is supplied to the source-side select gate line SGS.

A write pass voltage $V_{PASS}$ is supplied to unselected word lines WL. For example, the write pass voltage $V_{PASS}$ may be larger than the read pass voltage $V_{READ}$ in FIG. 11 and may be around the read pass voltage $V_{READ}$. This forms electron channels in the channel regions of the memory cells MC connected to the unselected word lines WL.

A write voltage $V_{PGM}$ is supplied to the selected word line WL. The write voltage $V_{PGM}$ is larger than the write pass voltage $V_{PASS}$.

Here, since the voltage $V_{SRC}$ is supplied to the channel regions of the write memory cells MC, a voltage around the write voltage $V_{PGM}$ is supplied to the gate insulating films 130 of the write memory cells MC. Accordingly, polarization states of the ferroelectric films 131 of the write memory cells MC can be changed.

On the other hand, the channel regions of the inhibit memory cells MC are separated both from the bit lines BL and from the source line SL, and are in electrically floating state. Channels of the inhibit memory cells MC have electric potentials with a magnitude around the write pass voltage $V_{PASS}$ by the capacitive coupling with the unselected word lines WL.

Accordingly, the gate insulating films 130 of the inhibit memory cells MC are supplied with voltages around the difference between the write voltage $V_{PGM}$ and the write pass voltage $V_{PASS}$ This ensures maintaining polarization states of the ferroelectric films 131 of the inhibit memory cells MC.

Note that, in the above description, the example in which the data is collectively written in all the memory cells MC included in one page PG in the write operation. However, in the write operation, the data may be written in one memory cell MC or the data may be collectively written only in a part of the memory cells MC included in one page PG. In this case, for example, bit lines BL connected to memory cells MC not as targets for the write operation may be supplied with the voltage $V_{DD}$.

[Erase Operation]

Figure 13:
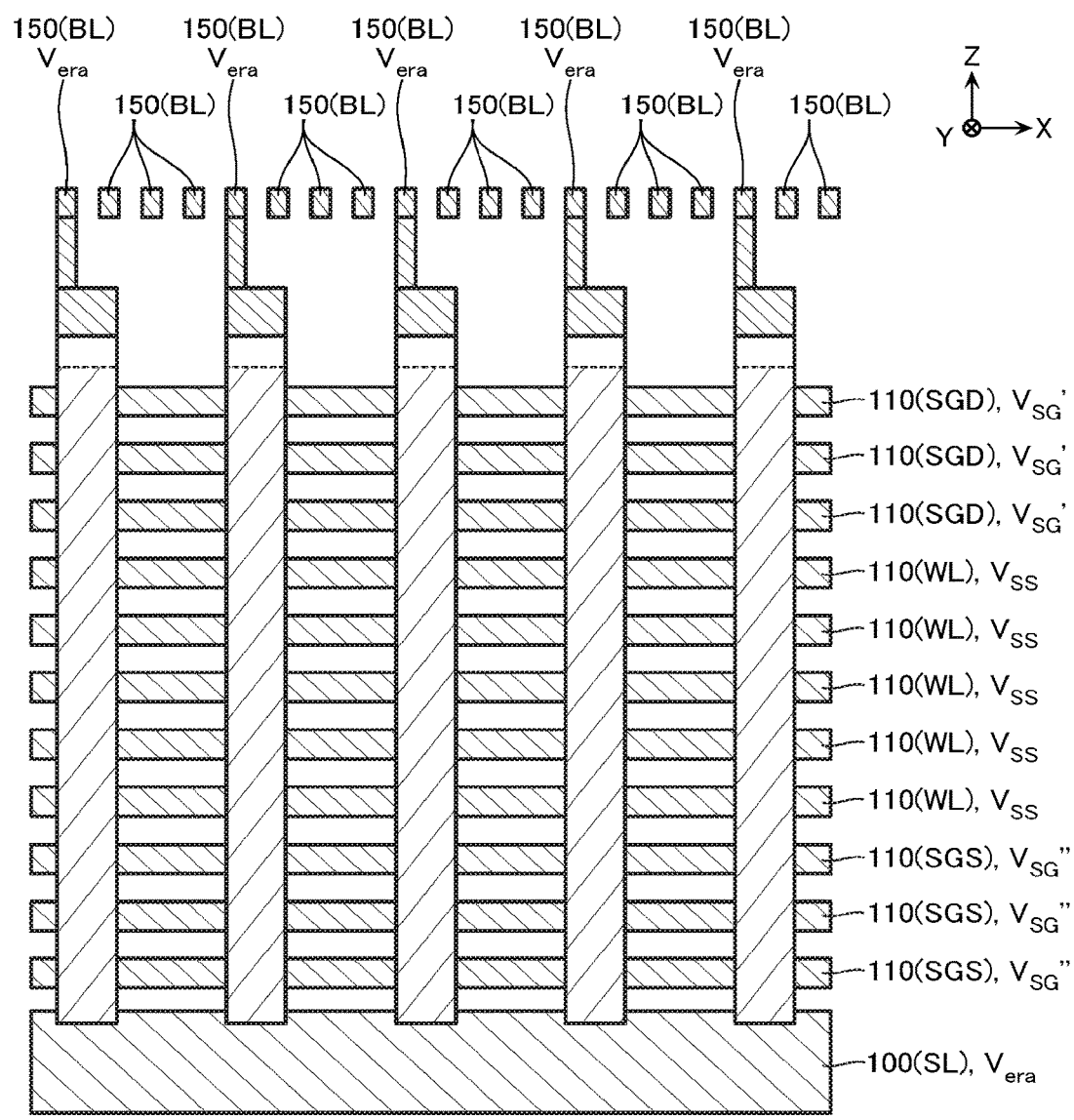
FIG. 13 is a schematic cross-sectional view for describing an erase operation.

Next, the erase operation will be described with reference to FIG. 13. FIG. 13 is a schematic cross-sectional view for describing the erase operation.

FIG. 13 describes the example in which data is collectively erased from one memory block BLK.

In the erase operation, for example, an erase voltage $V_{era}$ is supplied to the bit lines BL and the source line SL.

The holes are supplied to the semiconductor layer 120.

For example, in the illustrated example, a voltage $V_{SG}'$ is supplied to the drain-side select gate lines SGD. The voltage $V_{SG}'$ is at least smaller than the erase voltage $V_{era}$. The voltage $V_{SG}'$ is, for example, a voltage of a magnitude around which a Gate Induced Drain Leakage (GIDL) is generated in the drain-side select transistors STD. This generates the electrons and the holes pairs in the channel regions of the drain-side select transistors STD and the generated holes are supplied to the semiconductor layer 120.

For example, in the illustrated example, a voltage $V_{SG}''$ is supplied to the source-side select gate line SGS. The voltage $V_{SG}''$ is at least smaller than the erase voltage $V_{era}$. The difference between the voltage $V_{SG}''$ and the erase voltage $V_{era}$ is larger than the threshold voltage when the source-side select gate line SGS is operated as the PMOS transistor. Accordingly, in the channel region of the source-side select transistors STS, hole channels are formed. This supplies the holes in the semiconductor substrate 100 to the semiconductor layer 120.

The ground voltage $V_{SS}$ is supplied to the word lines WL. Here, since the erase voltage $V_{era}$ is supplied in the channel regions of the memory cells MC, the voltage around the erase voltage $V_{era}$ is supplied to the gate insulating films 130 of the memory cells MC. Accordingly, polarization states of the ferroelectric films 131 of the memory cells MC can be changed.

Note that, in the above description, the example in which the data is collectively erased from all the memory cells MC included in one memory block BLK in the erase operation has been described. However, in the erase operation, the data may be erased only from one memory cell MC or the data may be collectively erased only from a part of memory cells MC included in one memory block BLK. In this case, for example, the source-side select transistors STS may be set to the OFF state and a voltage smaller than the erase voltage $V_{era}$ may be supplied to bit lines BL connected to the memory cells MC not as targets for the erase operation.

In the above description, the example in which the holes are generated by GIDL in the drain-side select transistors STD to supply them to the semiconductor layer 120 and the holes are supplied to the semiconductor layer 120 from the source-side select transistors STS. However, in the erase operation, one of these can be omitted.

[Effect of Electric Charge Accumulated in Gate Insulating Film 130]

When the write operation is executed on the memory cell MC, the electrons in the channel formed on the outer peripheral surface of the semiconductor layer 120 tunnel into the gate insulating film 130 and accumulated in some cases. In such a case, the electric field by the polarization inversion and the electric field by the accumulated electrons cancel each other to cause a failure in preferably reading out the written data in some cases.

When the erase operation is executed on the memory cell MC, the holes in the channel formed on the outer peripheral surface of the semiconductor layer 120 tunnel into the gate insulating film 130 and accumulated in some cases. In such a case, the electric field by the polarization inversion and the electric field by the accumulated holes cancel each other to cause a failure in preferably reading out the erased data in some cases.

Here, for example, when the above-described write operation is executed on a memory cell MC controlled to be the upper state, the polarization state of the ferroelectric substance is inverted. In association with this, positive electric charge near the gate insulating film 130 is discharged to the semiconductor layer 120. On the other hand, even though the write operation described above is executed on the memory cell MC controlled to be the lower state, the polarization state of the ferroelectric substance is not inverted. Accordingly, positive electric charge is not discharged to the semiconductor layer 120. Accordingly, detecting this positive electric charge ensures reading out the data in the memory cell MC.

Similarly, for example, when the above-described erase operation is executed on a memory cell MC controlled to be the lower state, the polarization state of the ferroelectric substance is inverted. In association with this, negative electric charge near the gate insulating film 130 is discharged to the semiconductor layer 120. On the other hand, even though the erase operation described above is executed on the memory cell MC controlled to be the upper state, the polarization state of the ferroelectric substance is not inverted. Accordingly, negative electric charge is not discharged to the semiconductor layer 120. Accordingly, detecting this negative electric charge ensures reading out the data in the memory cell MC.

Hereinafter, the method in which the polarization state of the ferroelectric substance is inverted like this and the data in the memory cell MC is read out by this is sometimes referred to as a "destructive read operation". The read operation described with reference to FIG. 11 and the like is sometimes referred to as a "non-destructive read operation".

In the destructive read operation, the phenomenon in which the electric field by the dielectric polarization and the electric field by the electric charge accumulated in the ferroelectric film 131 are cancelled as described above does not occur. Therefore, the semiconductor memory device according to the embodiment is configured to execute the destructive read operation. This ensures preferably reading out the data in the memory cell MC.

The following exemplarily describes an execution method for the destructive read operation.

[First Destructive Read Operation]

Figure 14:
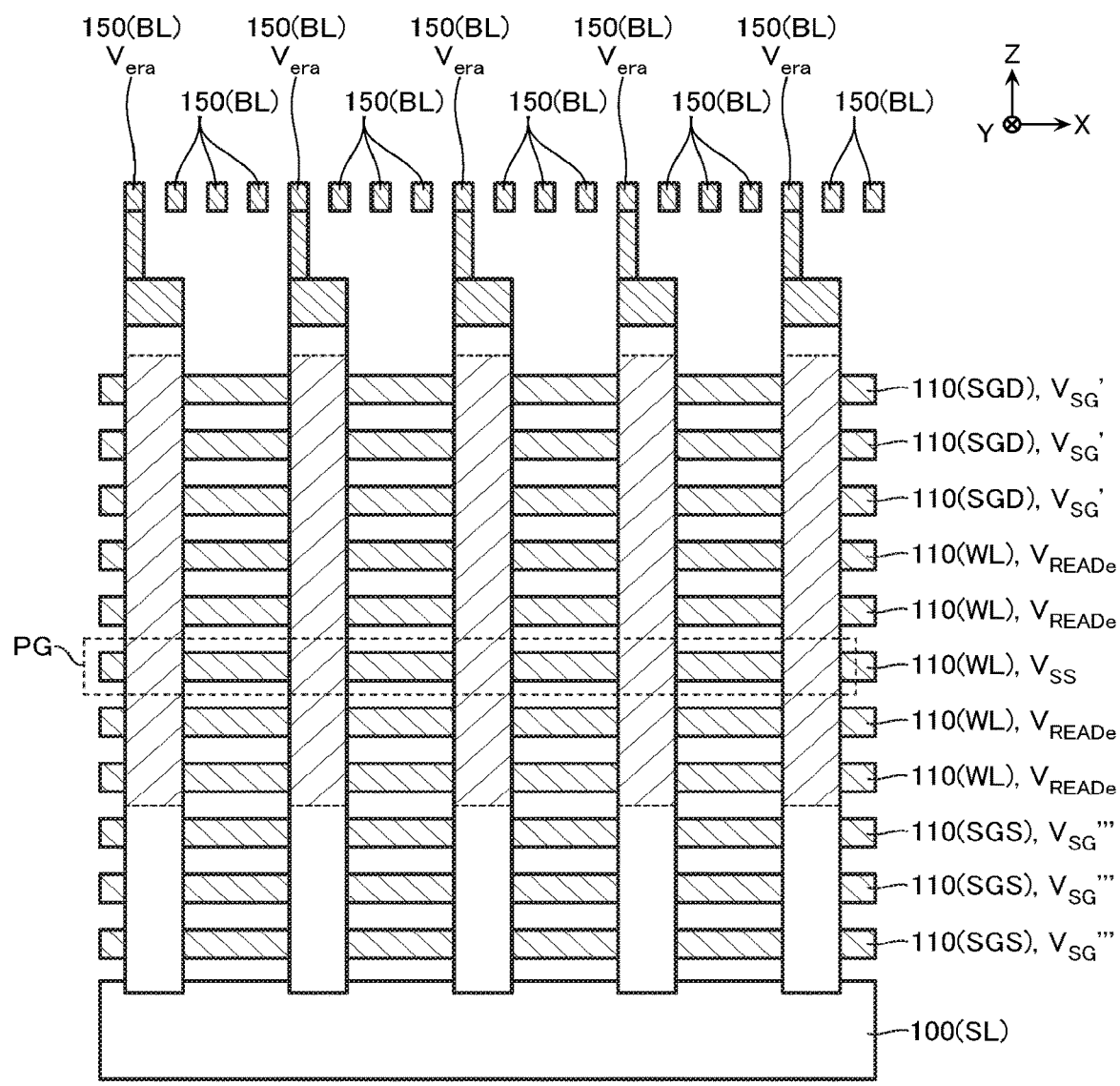
FIG. 14 is a schematic cross-sectional view for describing a first destructive read operation.

Next, with reference to FIG. 14, a first destructive read operation will be described. FIG. 14 is a schematic cross-sectional view for describing the first destructive read operation.

FIG. 14 describes the example in which the data is collectively read out from one page PG.

In the first destructive read operation, for example, the erase voltage $V_{era}$ is supplied to the bit lines BL. The holes are supplied to the semiconductor layers 120. For example, in the illustrated example, the voltage $V_{SG}'$ described with reference to FIG. 13 is supplied to the drain-side select gate line SGD.

The memory cells MC are electrically separated from the source line SL. For example, a voltage $V_{SG}'''$ is supplied to the source-side select gate line SGS. The difference between the voltage $V_{SG}'''$ and the erase voltage $V_{era}$ is smaller than the threshold voltage when the source-side select gate line SGS is operated as the PMOS transistor. Accordingly, in the channel region of the source-side select gate line SGS, the channel is not formed.

A destructive read pass voltage $V_{READe}$ is supplied to the unselected word lines WL. The difference between the destructive read pass voltage $V_{READe}$ and the erase voltage $V_{era}$ is larger than the threshold voltage when the memory cell MC is operated as the PMOS transistor. The destructive read pass voltage $V_{READe}$ may be, for example, an intermediate voltage between the erase voltage $V_{era}$ and the ground voltage $V_{SS}$. This forms hole channels in the channel regions of the memory cells MC.

The ground voltage $V_{SS}$ is supplied to the selected word line WL.

Here, the polarization states of the memory cells MC corresponding to the lower state in the selected page PG are inverted. In association with this, negative electric charges near the gate insulating film 130s are discharged to the semiconductor layers 120 and currents temporarily flow in the bit lines BL connected to such memory cells MC.

On the other hand, the polarization states of the memory cells MC controlled to be the upper state in the selected page PG are not inverted. Accordingly, the above-described currents do not flow in the bit lines BL connected to such memory cells MC.

The sense amplifier unit SAU (FIG. 3) in the peripheral circuit PC executes the sense operation.

As described above, in the sense operation, the sense node SEN is electrically conducted with the bit line BL. Here, when the sense node SEN is connected to the polarization inverted memory cell MC, the voltage of the sense node SEN becomes comparatively small. On the other hand, when the sense node SEN is connected to the memory cell MC not polarization inverted, the voltage of the sense node SEN becomes comparatively large.

Note that, in the above description, the example in which the data is collectively read out from all the memory cells MC included in one page PG in the first destructive read operation has been described. However, in the first destructive read operation, the data may be read out from only one memory cell MC or the data may collectively read out from only a part of the memory cells MC included in one page PG. In this case, for example, the erase voltage $V_{era}$ may be supplied to a bit line BL connected to the memory cell MC as a target for the first destructive read operation and the destructive read pass voltage $V_{READe}$ or the voltage $V_{SG}'$ may be supplied to the other bit lines BL.

After the first destructive read operation is terminated, the data is written back on the memory cells MC. The data may be written back on the same memory cell MC as the read out memory cells MC or may be written back on different memory cells MC. In the former case, the memory cells MC on which the first destructive read operation is executed are all in the upper state. Accordingly, for example, when the data is written back, the read out data may be used as the write data to execute the above-described write operation.

[Second Destructive Read Operation]

Figure 15:
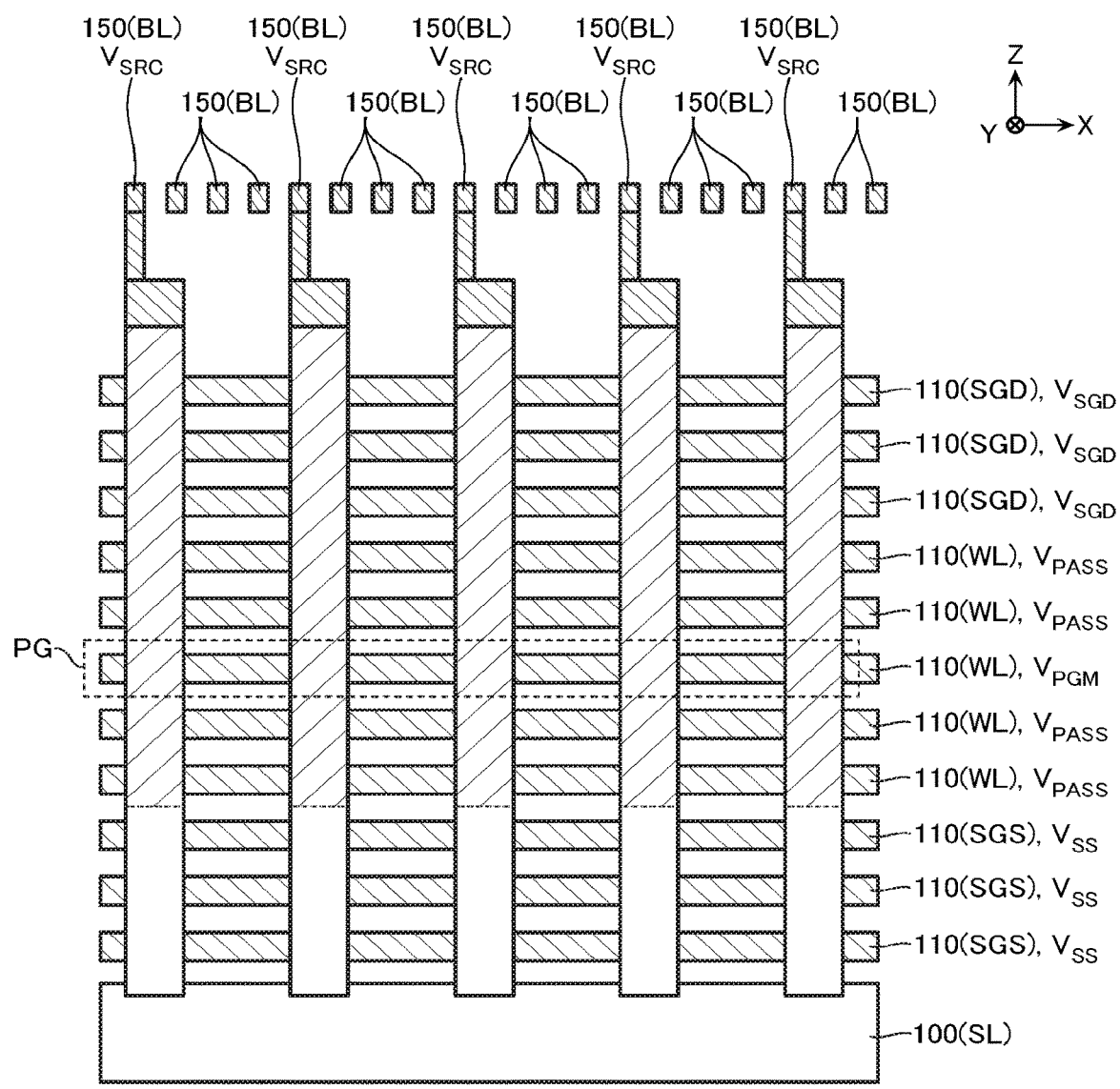
FIG. 15 is a schematic cross-sectional view for describing a second destructive read operation.

Next, with reference to FIG. 15, a second destructive read operation will be described. FIG. 15 is a schematic cross-sectional view for describing the second destructive read operation.

FIG. 15 describes the example in which the data is collectively read out from one page PG.

In the second destructive read operation, for example, the voltage $V_{SRC}$ is supplied to the bit lines BL.

The selected memory cells MC are electrically conducted with the bit lines BL. For example, the voltage $V_{SGD}$ is supplied to the drain-side select gate line SGD.

The memory cells MC are electrically separated from the source line SL. For example, the ground voltage $V_{SS}$ is supplied to the source-side select gate line SGS.

The write pass voltage $V_{PASS}$ is supplied to the unselected word lines WL. This forms electron channels in the channel regions of the memory cells MC connected to the unselected word lines WL.

The write voltage $V_{PGM}$ is supplied to the selected word line WL.

Here, the polarization states of the memory cells MC corresponding to the upper state in the selected page PG are inverted. In association with this, the positive electric charges near the gate insulating films 130 are discharged to the semiconductor layers 120, and currents temporarily flow in the bit lines BL connected to such memory cells MC.

On the other hand, the polarization states of the memory cells MC controlled to be the lower state in the selected page PG are not inverted. Accordingly, the above-described currents do not flow in the bit lines BL connected to such memory cells MC.

The sense amplifier unit SAU (FIG. 3) in the peripheral circuit PC executes a second sense operation.

The second sense operation is basically executed similarly to the above-described sense operation (hereinafter sometimes referred to as a "first sense operation"). However, in the first sense operation, the sense node SEN is charged before the sense node SEN is electrically conducted with the bit line BL. On the other hand, in the second sense operation, before the sense node SEN is electrically conducted with the bit line BL, the sense node SEN is discharged to make the voltage of the sense node SEN have a magnitude around the voltage $V_{SRC}$.

In the second sense operation, similarly to the first sense operation, the sense node SEN is electrically conducted with the bit line BL. Here, when the sense node SEN is connected to the polarization inverted memory cell MC, the voltage of the sense node SEN becomes comparatively large. On the other hand, when the sense node SEN is connected to the memory cell MC other than the polarization inverted memory cell MC, the voltage of the sense node SEN becomes comparatively small.

Note that, in the above description, the example in which the data is collectively read out from all the memory cells MC included in one page PG in the second destructive read operation has been described. However, in the second destructive read operation, the data may be read out from only one memory cell MC or the data may be collectively read out from only a part of the memory cells MC included in one page PG. In this case, for example, the voltage $V_{SRC}$ may be supplied to a bit line BL connected to the memory cell MC as a target for the second destructive read operation and the voltage $V_{DD}$ may be supplied to the other bit lines BL.

After the second destructive read operation is terminated, the data is written back on the memory cells MC. The data may be written back on the same memory cell MC as the read out memory cells MC or may be written back on different memory cells MC. In the former case, the memory cells MC on which the second destructive read operation is executed are all in the lower state. Accordingly, for example, when the data is written back, the above-described erase operation may control all the memory cells MC on which the second destructive read operation is executed to be the upper state once and the write operation that uses the read out data as the write data may be executed. For example, the above-described erase operation may be executed using the read out data as the write data.

[Third Destructive Read Operation]

Figure 16:
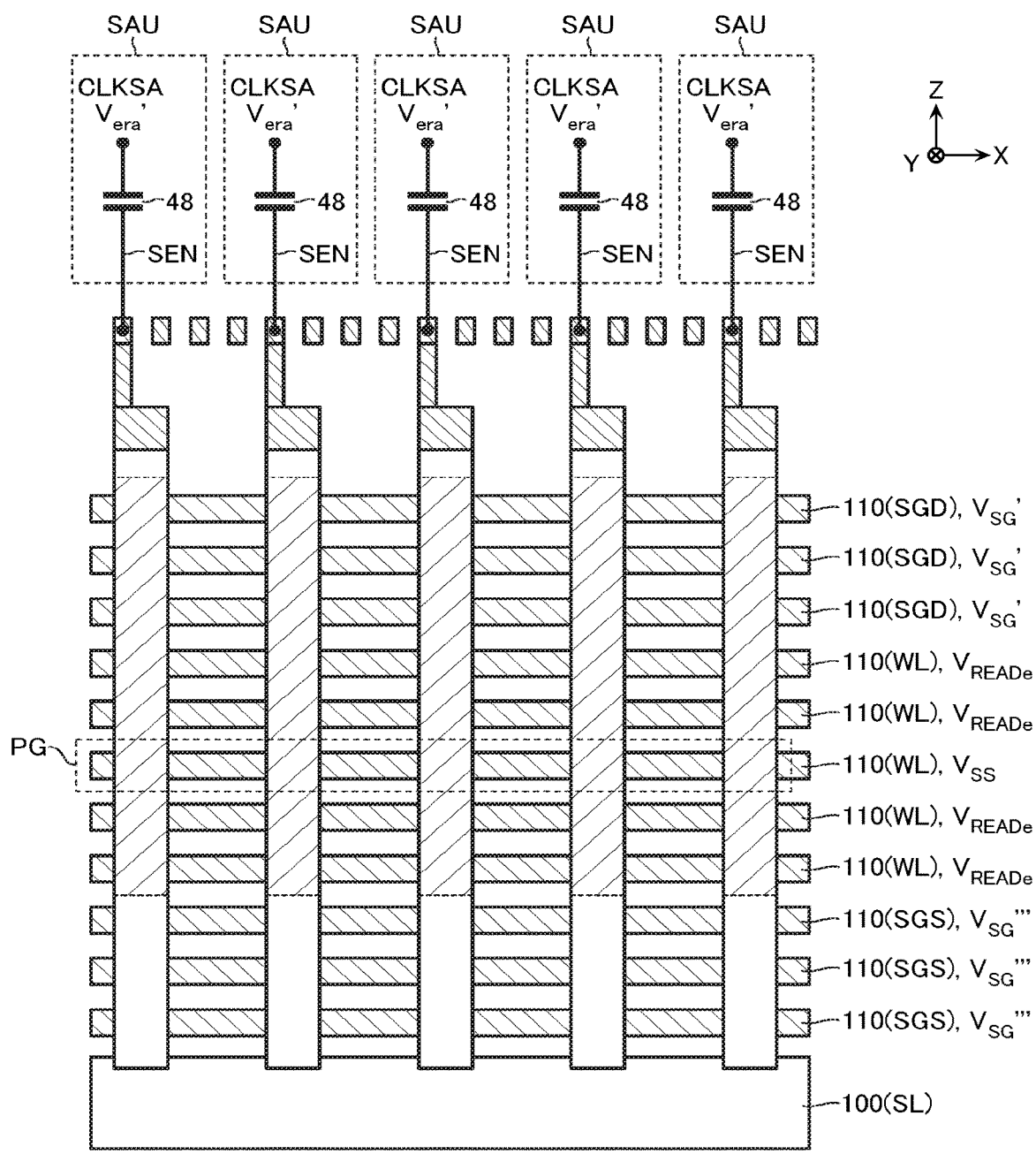
FIG. 16 is a schematic cross-sectional view for describing a third destructive read operation.

Next, a third destructive read operation will be described with reference to FIG. 16. FIG. 16 is a schematic cross-sectional view for describing the third destructive read operation.

FIG. 16 describes the example in which the data is collectively read out from one page PG.

The third destructive read operation is approximately the same as the first destructive read operation. However, as described with reference to FIG. 14, in the first destructive read operation, the ground voltage $V_{SS}$ is supplied to the word line WL in the state where the erase voltage $V_{era}$ is supplied to the bit line BL, and thereafter, the first sense operation is executed. Meanwhile, as illustrated in FIG. 16, in the third destructive read operation, the erase voltage $V_{era}'$ is supplied to the signal line CLKSA in a state where the bit lines BL are electrically conducted with the sense nodes SEN. The erase voltage $V_{era}'$ may be a voltage having a magnitude around the erase voltage $V_{era}$ or may be a voltage larger than the erase voltage $V_{era}$. This inverts the polarization states of the memory cells MC corresponding to the lower state and the negative electric charges near the gate insulating films 130 are discharged to the semiconductor layers 120. On the other hand, the polarization states of the memory cells MC controlled to be the upper state are not inverted.

Note that, in the above description, the example in which the data is collectively read out from all the memory cells MC included in one page PG in the third destructive read operation has been described. However, in the third destructive read operation, the data may be read out from only one memory cell MC or the data may be collectively read out from only a part of the memory cells MC included in one page PG.

After the third destructive read operation is terminated, the data is written back on the memory cells MC. The write back of the data corresponding to the third destructive read operation is, for example, executed similarly to the write back of the data corresponding to the first destructive read operation.

[Fourth Destructive Read Operation]

Figure 17:
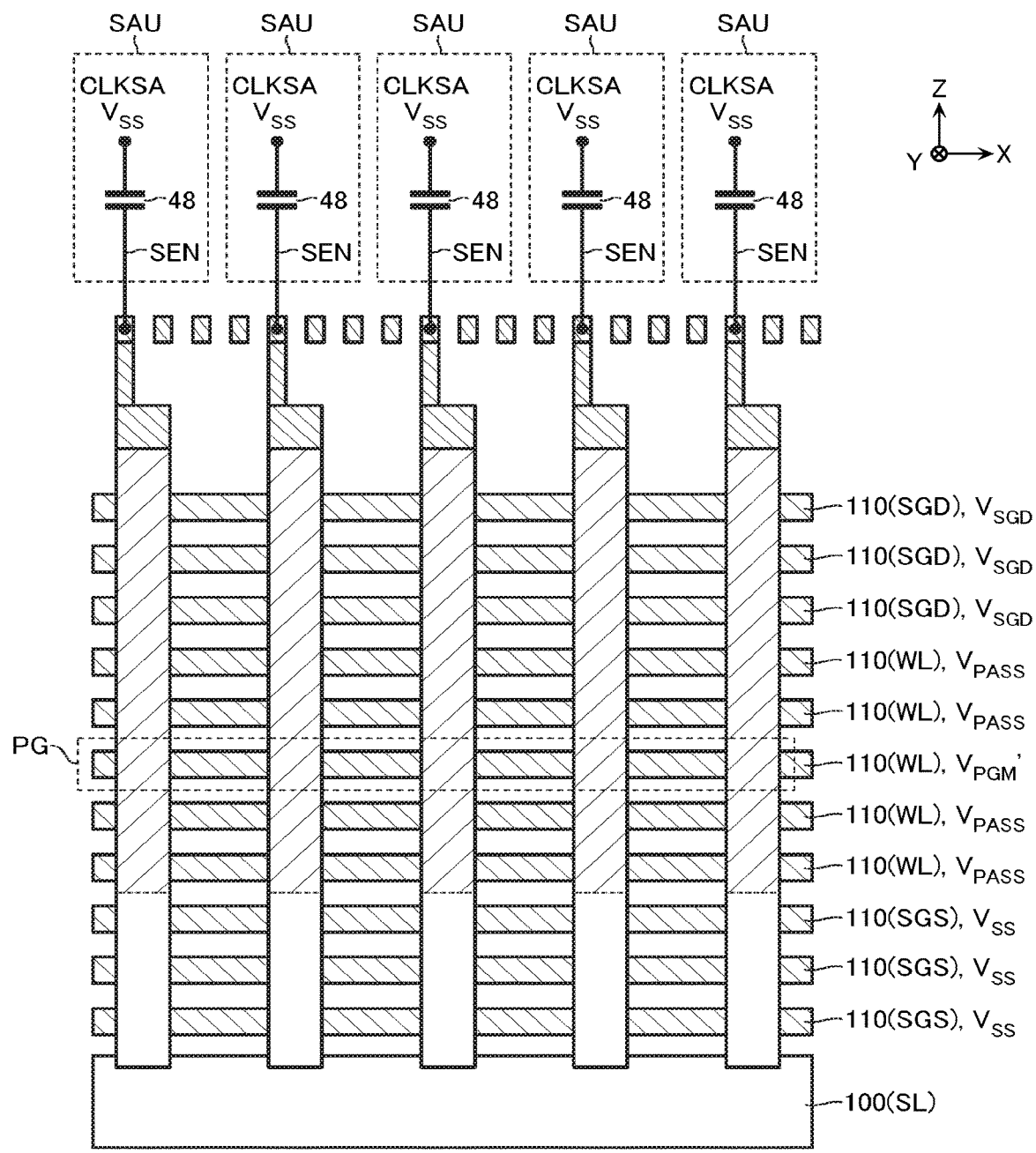
FIG. 17 is a schematic cross-sectional view for describing a fourth destructive read operation.

Next, a fourth destructive read operation will be described with reference to FIG. 17. FIG. 17 is a schematic cross-sectional view for describing the fourth destructive read operation.

FIG. 17 describes the example in which the data is collectively read out from one page PG.

The fourth destructive read operation is approximately the same as the second destructive read operation. However, as described with reference to FIG. 15, in the second destructive read operation, the write voltage $V_{PGM}$ is supplied to the word line WL in a state where the voltage $V_{SRG}$ is supplied to the bit line BL, and thereafter, the second sense operation is executed. Meanwhile, as illustrated in FIG. 17, in the fourth destructive read operation, the ground voltage $V_{SS}$ is supplied to the signal line CLKSA in a state where the bit lines BL are electrically conducted with the sense nodes SEN and the write voltage $V_{PGM}'$ is supplied to the word line WL in this state. The write voltage $V_{PGM}'$ may be a voltage having a magnitude around the write voltage $V_{PGM}$ and may be a voltage larger than the write voltage $V_{PGM}$. This inverts the polarization states of the memory cells MC corresponding to the upper state and the positive electric charges near the gate insulating films 130 are discharged to the semiconductor layers 120. On the other hand, the polarization states of the memory cells MC controlled to be the lower state are not inverted.

Note that, in the above description, the example in which the data is collectively read out from all the memory cells MC included in one page PG in the fourth destructive read operation has been described. However, in the fourth destructive read operation, the data may be read out from only one memory cell MC or the data may be collectively read out from only a part of the memory cells MC included in one page PG. In this case, for example, before the fourth destructive read operation is executed, the voltage $V_{SRC}$ may be supplied to the bit line BL connected to the memory cell MC as a target for the fourth destructive read operation, the voltage $V_{DD}$ may be supplied to the other bit lines BL, and the voltage $V_{SGD}$ may be supplied to the drain-side select gate line SGD.

After the fourth destructive read operation is terminated, the data is written back on the memory cells MC. The write back of the data corresponding to the fourth destructive read is, for example, executed similarly to the write back of the data corresponding to the second destructive read operation.

Second Embodiment

[Configuration]

Figure 18:
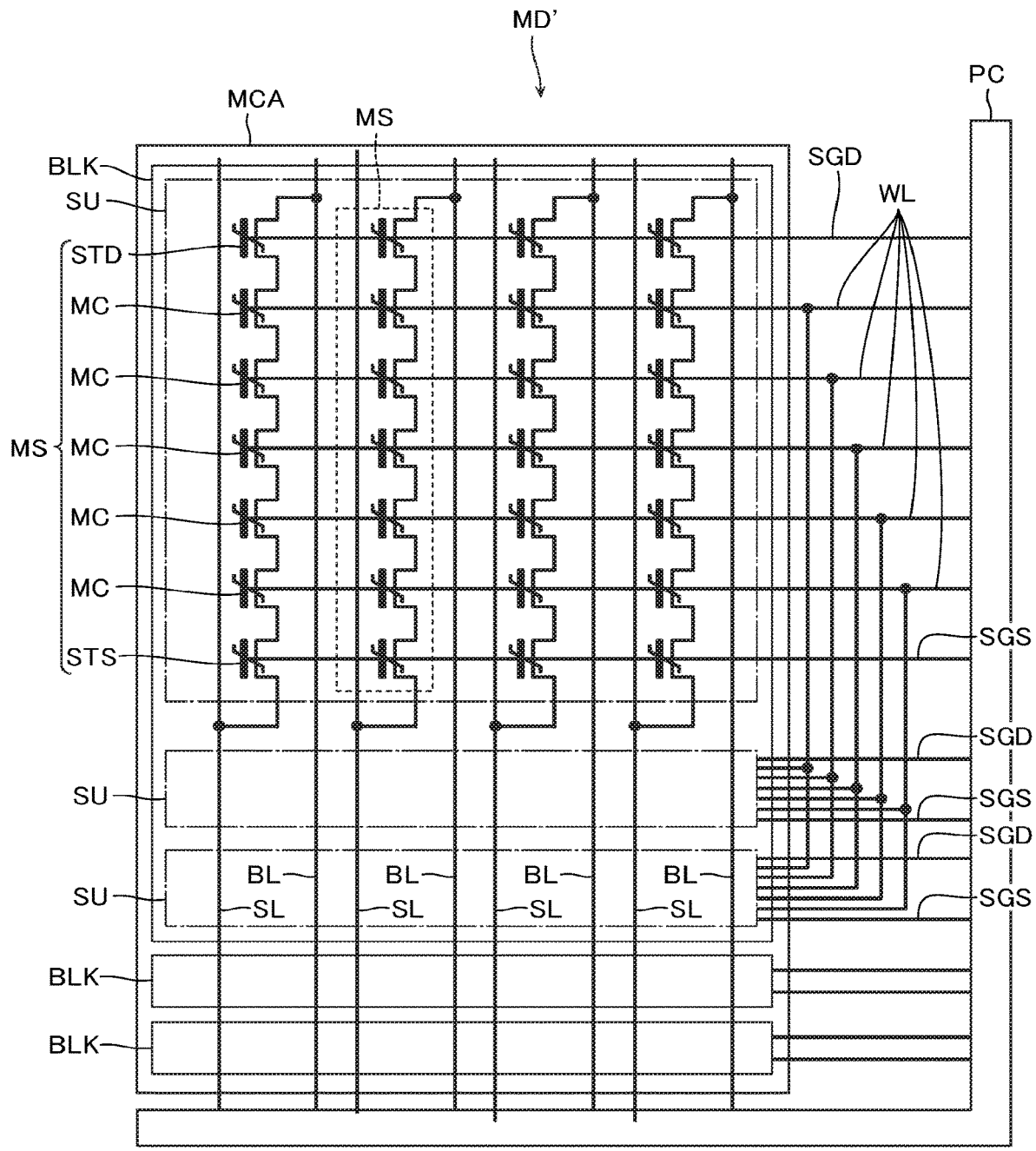
FIG. 18 is a schematic circuit diagram of a semiconductor memory device according to a second embodiment.
Figure 19:
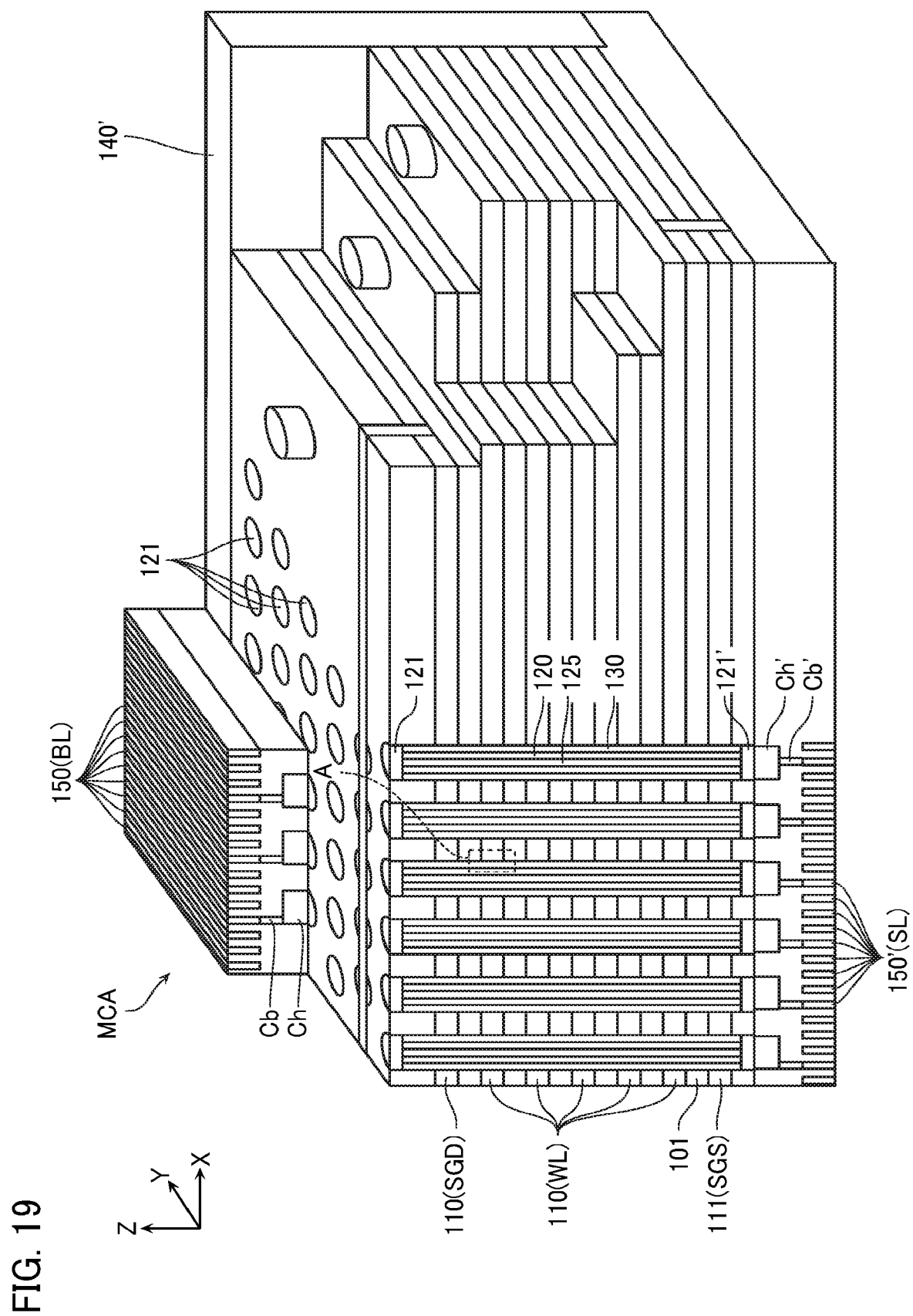
FIG. 19 is a schematic perspective view of the semiconductor memory device.

Next, a semiconductor memory device according to a second embodiment will be described with reference to FIG. 18 to FIG. 20. FIG. 18 is a schematic circuit diagram illustrating a configuration of a part of the memory die MD' according to the second embodiment. FIG. 19 is a schematic perspective view illustrating a configuration of a part of the memory die MD'.

The semiconductor memory device according to the second embodiment is basically configured similarly to the semiconductor memory device according to the first embodiment.

However, as described with reference to FIG. 2, in the semiconductor memory device according to the first embodiment, the plurality of memory strings MS included in the memory cell array MCA are connected to the peripheral circuit PC via one source line SL electrically in common. Meanwhile, as illustrated in FIG. 18, in the semiconductor memory device according to the second embodiment, the plurality of memory strings MS included in the memory cell array MCA is connected to the peripheral circuit PC via the plurality of source lines SL electrically independent.

As described with reference to FIG. 2, in the semiconductor memory device according to the first embodiment, the source-side select gate line SGS is connected in common to all the memory strings MS in the plurality of string units SU. Meanwhile, as illustrated in FIG. 18, in the semiconductor memory device according to the second embodiment, the source-side select gate line SGS is disposed corresponding to the string unit SU and is connected in common to all the memory strings MS in one string unit SU.

Even though the illustration is omitted, in the semiconductor memory device according to the second embodiment, not only the bit line BL but also the source line SL is connected to the sense amplifier unit SAU. The sense amplifier unit SAU connected to the source line SL may be common with or independent from one that is connected to the bit line BL.

As illustrated in FIG. 19, in the semiconductor memory device according to the second embodiment, below the plurality of semiconductor layers 120, a plurality of conductive layers 150' are disposed. The plurality of conductive layers 150' are basically configured similarly to the plurality of conductive layers 150. However, the plurality of conductive layers 150' function as the source lines SL not as the bit lines BL.

In the semiconductor memory device according to the first embodiment, as described with reference to FIG. 5, the lower end portions of the semiconductor layers 120 are connected to the P-type well region of the semiconductor substrate 100 via the semiconductor layers 122 made of single-crystal silicon (Si) or the like. Meanwhile, as illustrated in FIG. 19, in the semiconductor memory device according to the second embodiment, impurity regions 121' containing P-type impurities, such as boron (B), are disposed in the lower end portions of the plurality of semiconductor layers 120. The impurity regions 121' are connected to the source lines SL via contacts Ch' and contacts Cb'.

As described with reference to FIG. 5, the semiconductor memory device according to the first embodiment includes the conductive layer 140 connected to the semiconductor substrate 100. Meanwhile, as illustrated in FIG. 19, the semiconductor memory device according to the second embodiment includes an insulating layer 140' instead of the conductive layer 140.

[Fifth Destructive Read Operation]

Next, with reference to FIG. 20, a fifth destructive read operation will be described. FIG. 20 is a schematic cross-sectional view for describing the fifth destructive read operation.

Figure 20:
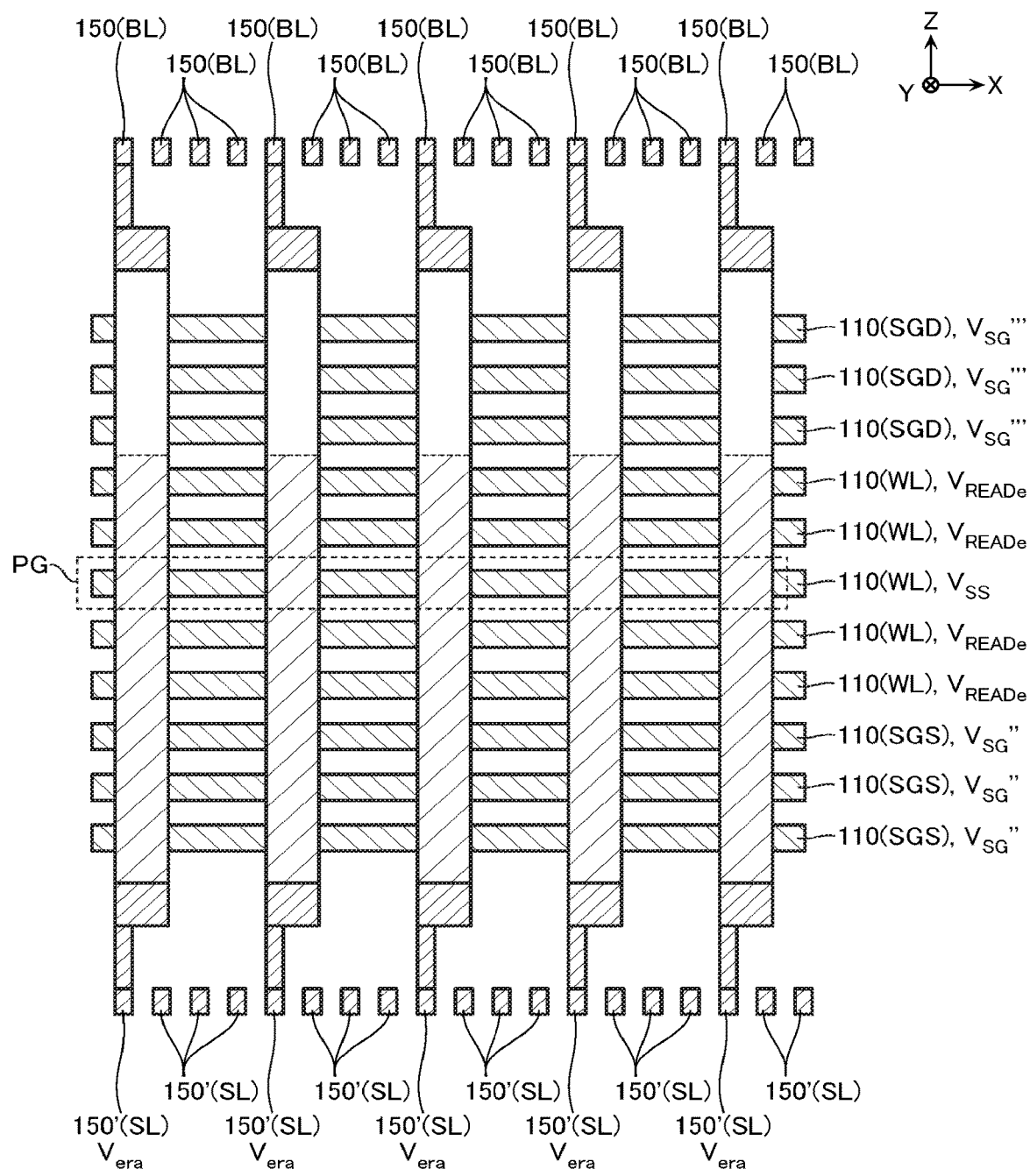
FIG. 20 is a schematic cross-sectional view for describing a fifth destructive read operation

FIG. 20 describes the example in which the data is collectively read out from one page PG.

The semiconductor memory device according to the second embodiment is configured to execute the fifth destructive read operation. Note that the semiconductor memory device according to the second embodiment may be configured to execute at least one of the first to the fourth destructive read operations.

In the fifth destructive read operation, for example, the erase voltage $V_{era}$ is supplied to the source lines SL.

The holes are supplied to the semiconductor layers 120. For example, in the illustrated example, the voltage $V_{SG}''$ is supplied to the source-side select gate line SGS.

The memory cells MC are electrically separated from the bit lines BL. For example, the voltage $V_{SG}'''$ is supplied to the drain-side select gate lines SGD.

The destructive read pass voltage $V_{READe}$ is supplied to the unselected word lines WL. This forms hole channels in the channel regions of the memory cells MC.

The ground voltage $V_{SS}$ is supplied to the selected word line WL. This inverts the polarization states of the memory cells MC corresponding to the lower state and the negative electric charges near the gate insulating films 130 are discharged to the semiconductor layers 120. On the other hand, the polarization states of the memory cells MC controlled to be the upper state are not inverted.

The sense amplifier unit SAU (FIG. 3) in the peripheral circuit PC executes a third sense operation.

The third sense operation is basically executed similarly to the above-described first sense operation. However, in the third sense operation, the sense node SEN is electrically conducted with the source line SL instead of the bit line BL. When the sense node SEN is connected to the polarization inverted memory cell MC, the voltage of the sense node SEN becomes comparatively small. On the other hand, when the sense node SEN is connected to the memory cell MC other than the polarization inverted memory cell MC, the voltage of the sense node SEN becomes comparatively large.

Note that, in the above description, the example in which the data is collectively read out from all the memory cells MC included in one page PG in the fifth destructive read operation has been described. However, in the fifth destructive read operation, the data may be read out from only one memory cell MC or the data may be collectively read out from only a part of the memory cells MC included in one page PG. In this case, for example, the erase voltage $V_{era}$ may be supplied to a source line SL connected to the memory cell MC as a target for the fifth destructive read operation and the destructive read pass voltage $V_{READe}$ may be supplied to the other source lines SL.

After the fifth destructive read operation is terminated, the data is written back to the memory cells MC. The write back of the data corresponding to the fifth destructive read operation is, for example, executed similarly to the write back of the data corresponding to the first destructive read operation.

Third Embodiment

Next, the semiconductor memory device according to a third embodiment will be described.

When the destructive read operation is executed, the data once read out needs to be written back again. Accordingly, compared with the case where the non-destructive read operation is executed, the operating speed sometimes decreases. When the destructive read operation is executed, compared with the case where the non-destructive read operation is executed, deterioration of the memory cell MC easily progresses in some cases.

Here, the phenomenon in which the electric field by the dielectric polarization and the electric field by the electric charge accumulated in the gate insulating film 130 cancel each other tends to increase together with the increase of the number of write/erase.

Therefore, in the semiconductor memory device according to the third embodiment, operating conditions of the read operation are switched corresponding to the number of write/erase. That is, until the number of write/erase reaches the predetermined number, the data of the memory cell MC is read out by a non-destructive read operation. After the number of write/erase reaches the predetermined number, the data of the memory cell MC is read out by any one of the first to fifth destructive read operations.

With such a method, while the operating speed is maintained when the number of write/erase is comparatively low, a long life of the semiconductor memory device can be achieved.

The following more specifically describes an operation of the semiconductor memory device according to the embodiment.

[Range of Operating Condition Switch]

It is appropriately adjustable in what range the operating conditions are switched. For example, in the whole memory system 10 (FIG. 1), the operating conditions may be switched. The operating condition may be switched for each memory die MD (FIG. 1). The operating conditions may be switched for each memory cell array region $R_{MCA}$ (FIG. 4). The operating condition may be switched for each memory block BLK (FIG. 2). The operating conditions may be switched for each string unit SU (FIG. 2). The operating conditions may be switched for each page PG.

Figure 21:
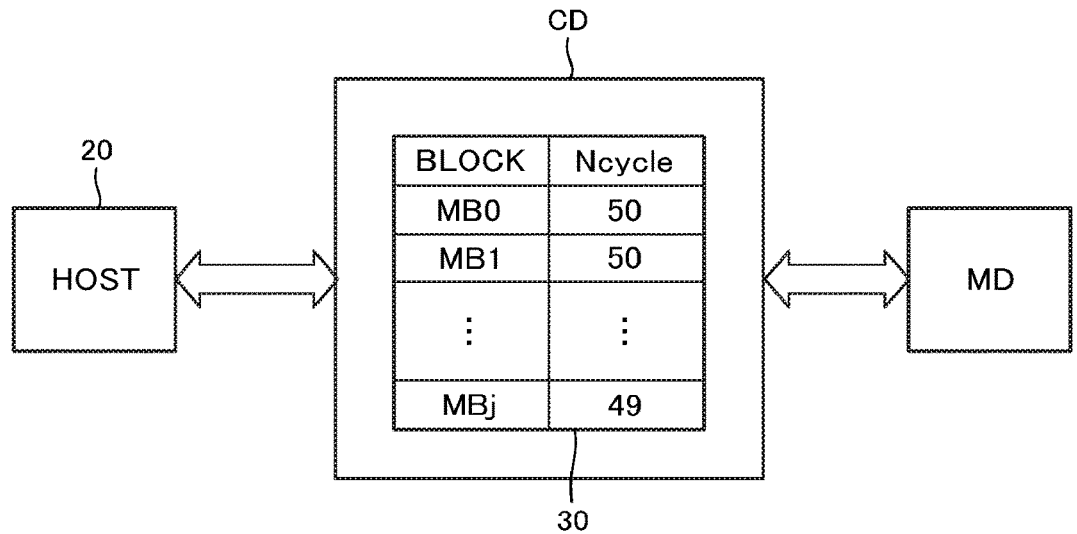
FIG. 21 is a schematic block diagram of a semiconductor memory device according to a third embodiment.

For example, as illustrated in FIG. 21, the controller die CD sometimes includes a table 30 that monitors the number of write/erase by each memory block BLK. This table 30 is, for example, used in an operation for equalizing the number of write/erase between the memory blocks BLK (wear leveling). Here, when the operating conditions are switched for each memory block BLK, this table 30 can be used.

[Timing of Switching Operating Conditions]

Figure 22:
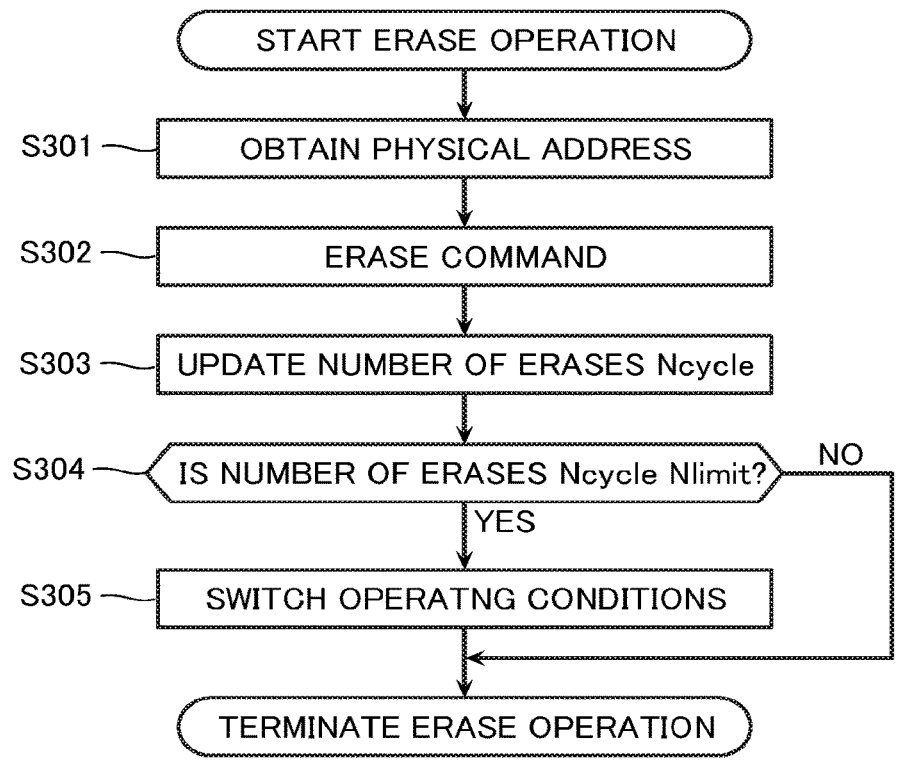
FIG. 22 is a schematic flowchart for describing an operation of the semiconductor memory device.

It is appropriately adjustable at what timing the operating conditions are switched. In FIG. 22, an operation that switches the operating conditions after executing the erase operation is exemplarily illustrated.

For example, at step S301 in FIG. 22, the controller die CD obtains a physical address of the memory block BLK on which the erase operation is executed. At step S302, a command set of executing the erase operation is input to the memory die MD. At step S303, the table 30 exemplarily illustrated in FIG. 21 is accessed to update the number of erases Ncycle. At step S304, whether the number of erases Ncycle is the predetermined number of Nlimit or not is determined, and when it is Nlimit, the procedure proceeds to step S305, and when it is not Nlimit, the process is terminated. At step S305, the operating conditions are switched.

[Change of Command Set in Association with Switching of Operating Conditions]

When the command set of executing the read operation is received from the host computer 20, the controller die CD executes, for example, a conversion of a logical address and a physical address, generates a command set, and input it to the memory die MD. Here, the command set input from the controller die CD to the memory die MD in the destructive read out may be the same command set input from the controller die CD to the memory die MD in the non-destructive read out or may be different. When these commands are the same, a parameter for specifying the operating conditions may be latched onto the memory die MD. When these commands are different, the parameter for specifying the operating conditions may be latched onto the controller die CD. At step S305 in FIG. 22, such a parameter latched within the memory die MD or the controller die CD may be switched.

Fourth Embodiment

Next, a semiconductor memory device according to a fourth embodiment will be described with reference to FIG. 23 and FIG. 24.

The semiconductor memory device according to the fourth embodiment is basically configured similarly to the semiconductor memory device according to the third embodiment. However, in the semiconductor memory device according to the third embodiment, the operating conditions of the read operation are switched corresponding to the number of write/erase. On the other hand, in the semiconductor memory device according to the fourth embodiment, an operation that detects a characteristic change of the gate insulating film 130 is executed at a predetermined timing and the operating conditions of the read operation is switched in accordance with the result of this operation.

Figure 23:
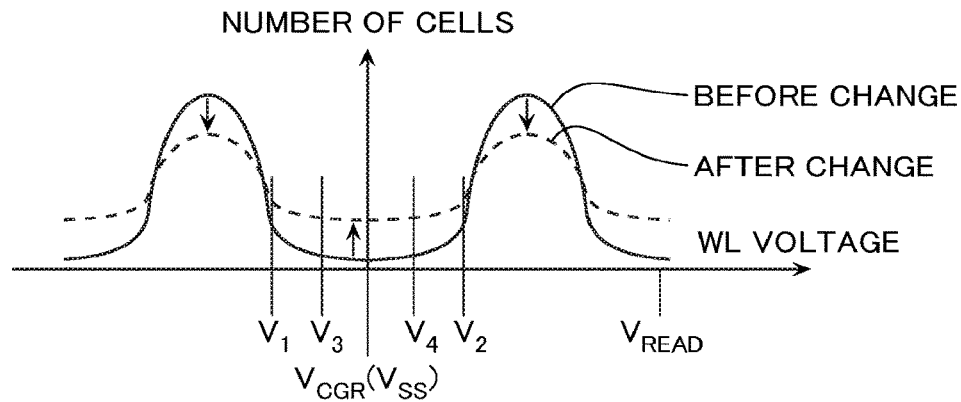
FIG. 23 is a schematic histogram for describing an operation of a semiconductor memory device according to a fourth embodiment.

FIG. 23 is a schematic histogram for describing threshold voltages of the memory cells MC. FIG. 23 basically illustrates a characteristic similar to that in FIG. 7. However, FIG. 23 illustrates threshold voltages of the memory cells MC before the characteristic of the gate insulating film 130 changes by a solid line. Threshold voltages of the memory cells MC after the characteristic of the gate insulating film 130 changes is illustrated by a dotted line.

As illustrated, when the characteristic of the gate insulating film 130 changes, the number of memory cells MC whose threshold voltage is larger than the voltage $V_1$ regardless of being controlled to be the lower state increases. The number of memory cells MC whose threshold voltage is smaller than the voltage $V_2$ regardless of being controlled to be the upper state increases.

Figure 24:
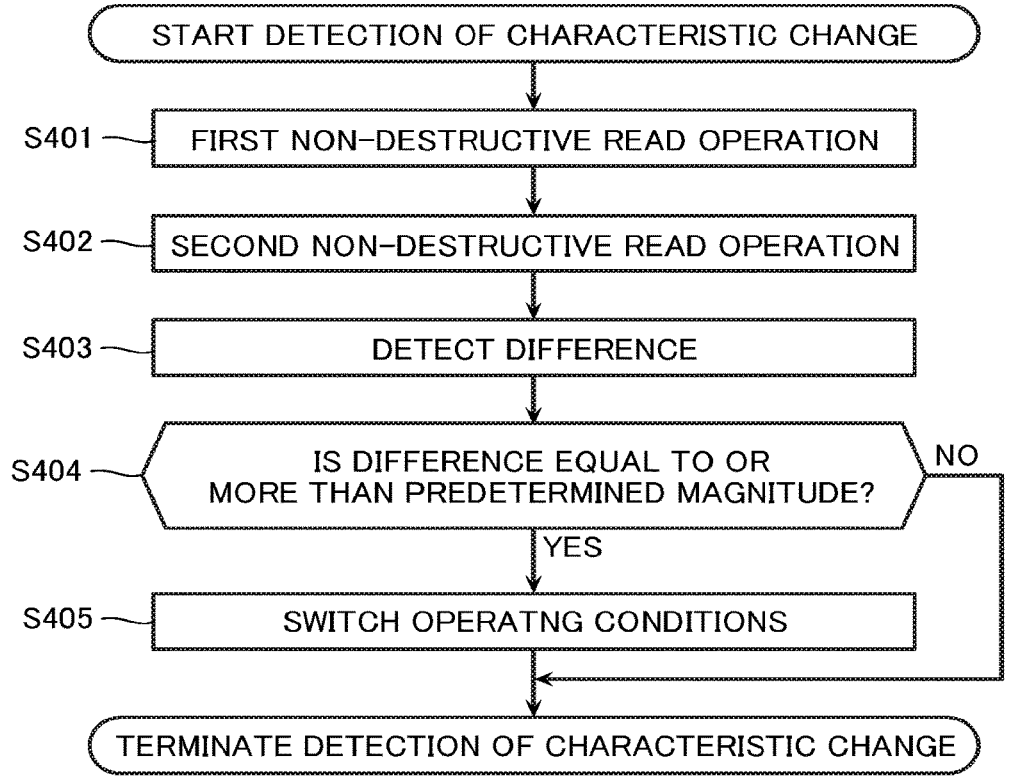
FIG. 24 is a schematic flowchart for describing the operation of the semiconductor memory device.

In the operation that detects a characteristic change of the gate insulating film 130, for example, at step S401 in FIG. 24, the memory die MD executes a first non-destructive read operation. The first non-destructive read operation is basically executed similarly to the above-described non-destructive read operation. However, in the first non-destructive read operation, not the read voltage $V_{CGR}$ but a voltage $V_3$ (FIG. 23) is supplied to the selected word line WL. The voltage $V_3$ is, for example, larger than the voltage $V_1$ and smaller than the read voltage $V_{CGR}$.

At step S402 in FIG. 24, the memory die MD executes a second non-destructive read operation. The second non-destructive read operation is basically executed similarly to the above-described non-destructive read operation. However, in the second non-destructive read operation, not the read voltage $V_{CGR}$ but a voltage $V_4$ (FIG. 23) is supplied to the selected word line WL. The voltage $V_4$ is, for example, larger than the read voltage $V_{CGR}$ and smaller than the voltage $V_2$.

At step S403 in FIG. 24, the memory die MD compares the number of the memory cells MC determined to be the lower state or the upper state in the first non-destructive read operation and the number of the memory cells MC determined to be the lower state or the upper state in the second non-destructive read operation to detect the difference.

At step S404 in FIG. 24, it is determined whether a magnitude of the detected difference is equal to or more than a predetermined magnitude or not, and when it is equal to or more than the predetermined magnitude, the procedure proceeds to step S405, and when it is not equal to or more than the predetermined magnitude, the process is terminated. At step S405, the command set of switching the operating conditions is input to the memory die MD.

Fifth Embodiment

Figure 25:
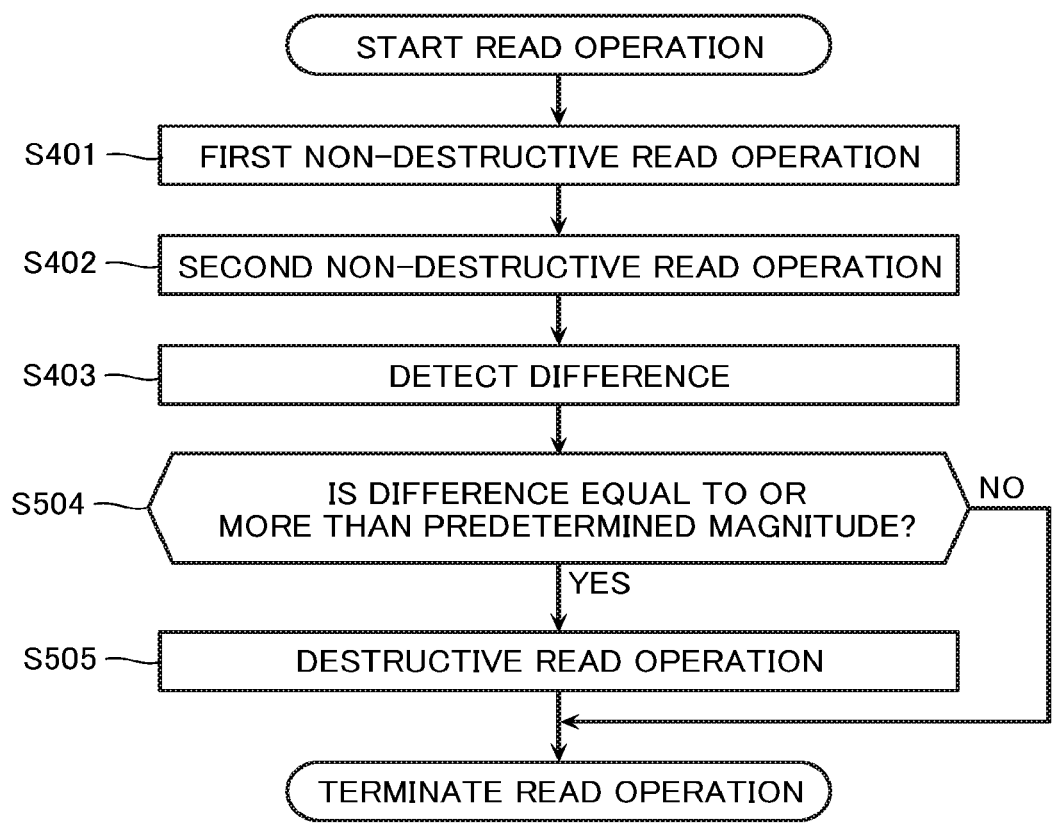
FIG. 25 is a schematic flowchart for describing an operation of a semiconductor memory device according to a fifth embodiment.

Next, a semiconductor memory device according to the fifth embodiment will be described with reference to FIG. 25. FIG. 25 is a schematic flowchart for describing a read operation of the semiconductor memory device according to the fifth embodiment.

Steps S401 to S403 of the read operation of the semiconductor memory device according to the fifth embodiment are executed similarly to steps S401 to S403 of the operation described with reference to FIG. 24.

At step S504 in FIG. 25, it is determined whether the above-described detected magnitude of the difference is equal to or more than the predetermined magnitude or not. Note that, for example, when the data is readout only from one memory cell MC, the above-described predetermined magnitude is set to 1. When the above-described detected magnitude of the difference is equal to or more than the predetermined magnitude, the procedure proceeds to step S505. On the other hand, when the above-described detected magnitude of the difference is not equal to or more than the predetermined magnitude, the data obtained in the sense operation at step S401 or step S402 is used as the read data to output this to the controller die CD (FIG. 1).

At step S505 in FIG. 25, the memory die MD executes the destructive read operation. The destructive read operation may be, for example, any one of the above-described first to fifth destructive read operation.

Note that, in the third embodiment and the fourth embodiment, the data of the memory cell MC is read out by the non-destructive read operation until the predetermined conditions are satisfied. After the predetermined conditions are satisfied, the data of the memory cell MC is read out by anyone of the first to fifth destructive read operations. Such an operation can be combined with the read operation as described with reference to FIG. 25.

For example, the operation before the predetermined conditions are satisfied or after the predetermined conditions are satisfied may be the read operation as described with reference to FIG. 25. For example, it is possible that the data of the memory cell MC is read out by the non-destructive read operation until a first condition is satisfied, the data of the memory cell MC is read out by the read operation as described with reference to FIG. 25 after the first condition is satisfied and until a second condition is satisfied, and the data of the memory cell MC is read out by any one of the first to fifth destructive read operations after the second condition is satisfied.

Other Embodiments

The semiconductor memory devices according to the first embodiment to the fifth embodiment have been described above. However, configurations described above are merely examples, and a specific configuration, an operation method, and the like are appropriately adjustable.

For example, in the semiconductor memory device according to the third embodiment, the operating conditions are switched at the point when the number of write/erase reaches the predetermined number, and not the non-destructive read out but the destructive read operation is executed. However, such a configuration is merely an example, and it is appropriately adjustable as to what condition the switching of the operating condition is caused by. For example, the operating conditions may be switched at the point when a bit error rate reaches the predetermined number.

For example, in the first embodiment, as described with reference to FIG. 5 and the like, the lower end of the semiconductor layer 120 is connected to the semiconductor substrate 100. However, such a configuration is merely an example, and a specific configuration is appropriately adjustable. For example, the lower end of the semiconductor layer 120 may contain N-type or P-type impurities and may be connected to another semiconductor layer separated from the semiconductor substrate 100.

For example, as described with reference to FIG. 5 and the like, in the first embodiment, the outer peripheral surface of the semiconductor layer 120 is surrounded by the conductive layers 110. However, such a configuration is merely an example, and a specific configuration is appropriately adjustable.

Figure 26:
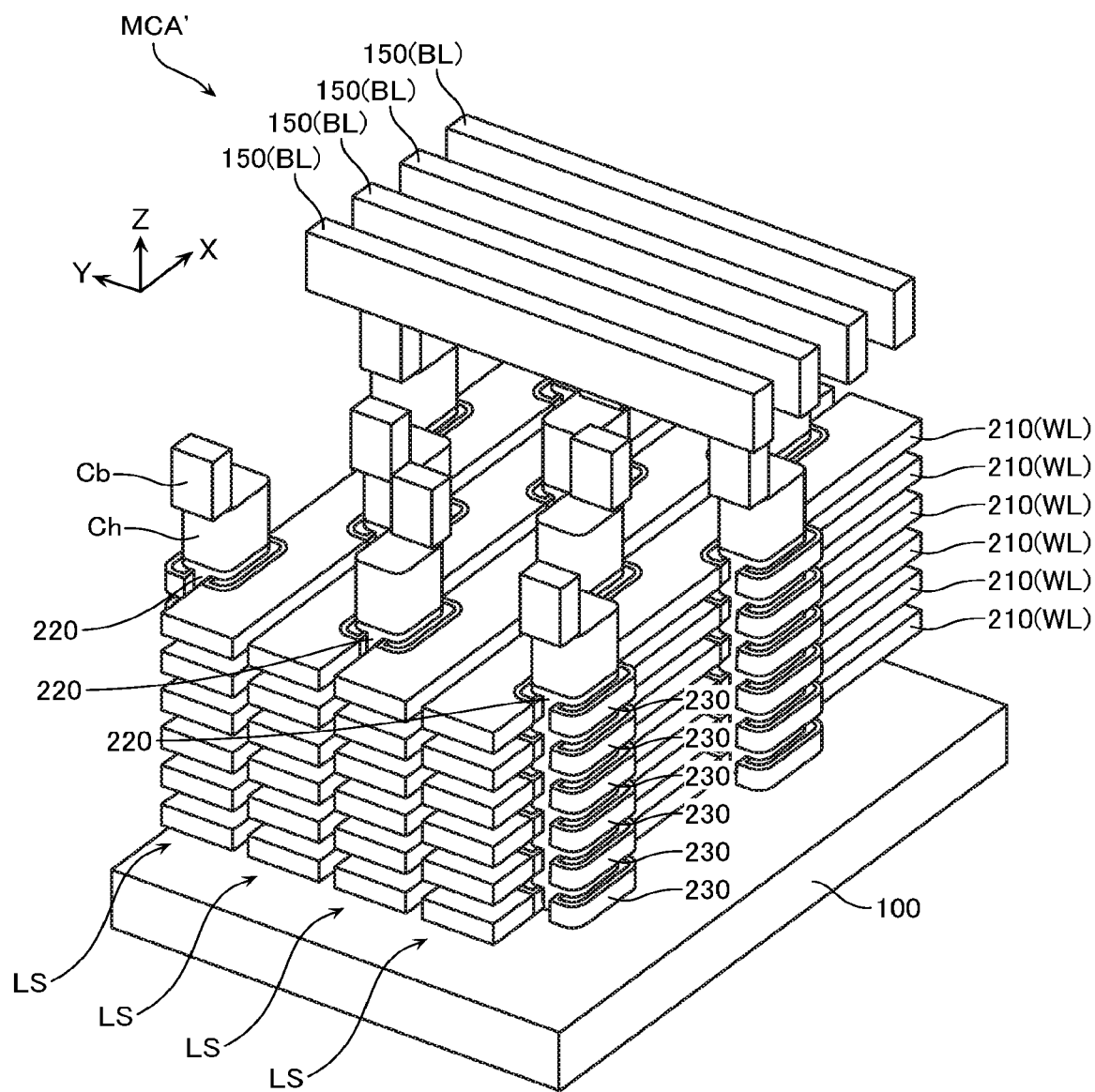
FIG. 26 is a schematic perspective view illustrating a configuration of a part of a semiconductor memory device according to another embodiment.

For example, the memory cell array MCA' exemplarily illustrated in FIG. 26 includes a plurality of stacked structures LS arranged in the Y-direction. The plurality of stacked structures LS includes a plurality of respective conductive layers 210 arranged in the Z-direction. Between the two stacked structures LS adjacent in the Y-direction, a plurality of semiconductor layers 220 arranged in the X-direction are disposed. The plurality of semiconductor layers 220 extend in the Z-direction and are opposed to the plurality of conductive layers 210 included in the two stacked structures LS. Between the plurality of conductive layers 210 and the plurality of semiconductor layers 220, respective gate insulating films 230 are disposed.

The conductive layer 210, the semiconductor layer 220, and the gate insulating film 230 are similarly configured to the conductive layer 110, the semiconductor layer 120, and the gate insulating film 130, respectively. However, the two conductive layers 210 adjacent in the Y-direction function as the two word lines WL electrically independent. The respective gate insulating films 230 are disposed between the plurality of conductive layers 210 and the plurality of semiconductor layers 220. That is, the two gate insulating films 230 adjacent in the Y-direction are separated from one another. Similarly, the two gate insulating film 230 adjacent in the Z-direction are separated from one another.

It is possible to execute the operation similar to those in each embodiment described above in the semiconductor memory device including such a memory cell array MCA'.

For example, as described with reference to FIG. 5 and the like, the memory cell array MCA according to the first embodiment includes the plurality of conductive layers 110 arranged in the Z-direction, the plurality of semiconductor layers 120 extending in the Z-direction, and the plurality of gate insulating films 130 respectively disposed between the plurality of conductive layers 110 and the plurality of semiconductor layers 120. However, such a configuration is merely an example, and a specific configuration is appropriately adjustable.

Figure 27:
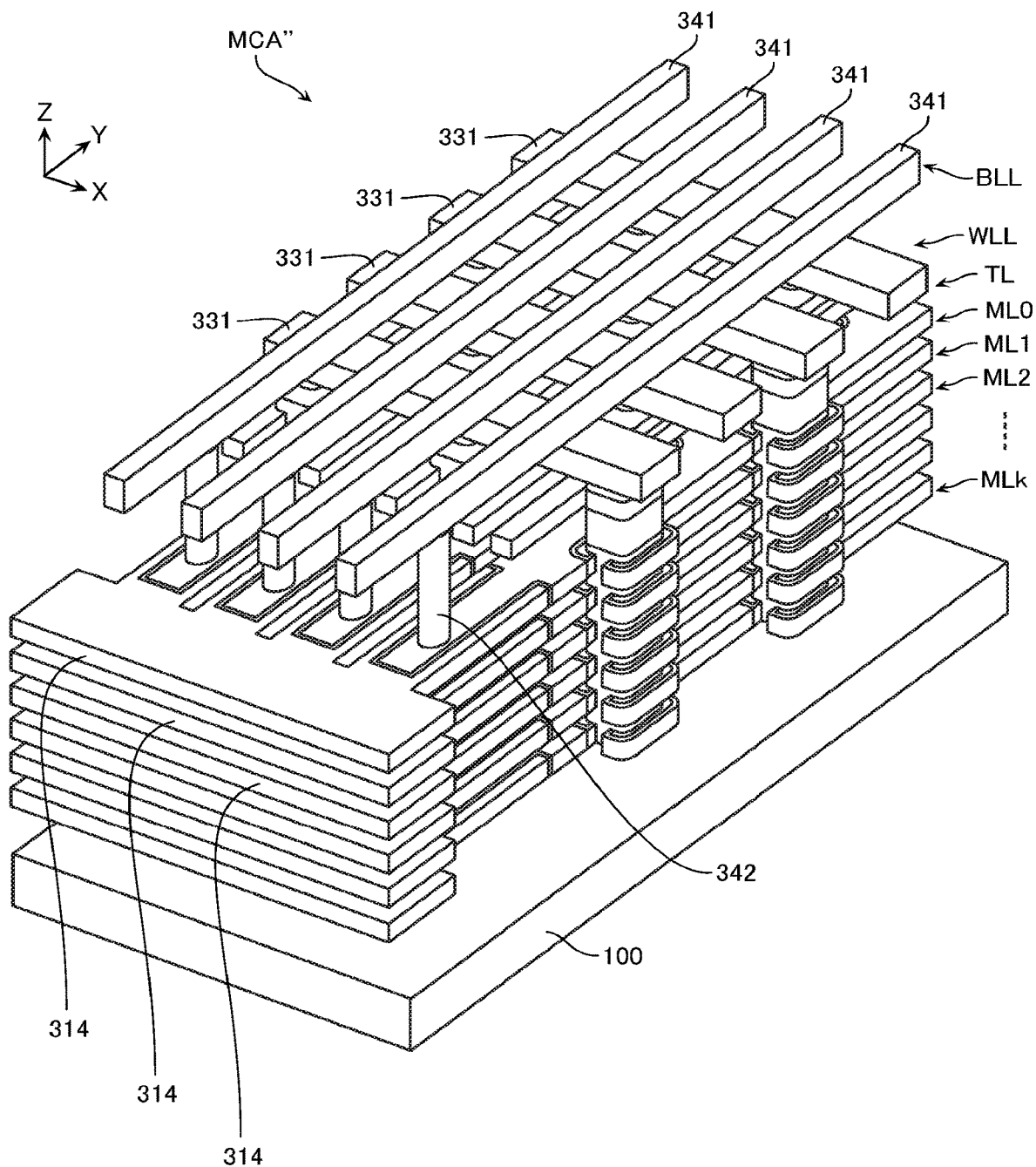
FIG. 27 is a schematic perspective view illustrating a configuration of a part of a semiconductor memory device according to another embodiment.
Figure 28:
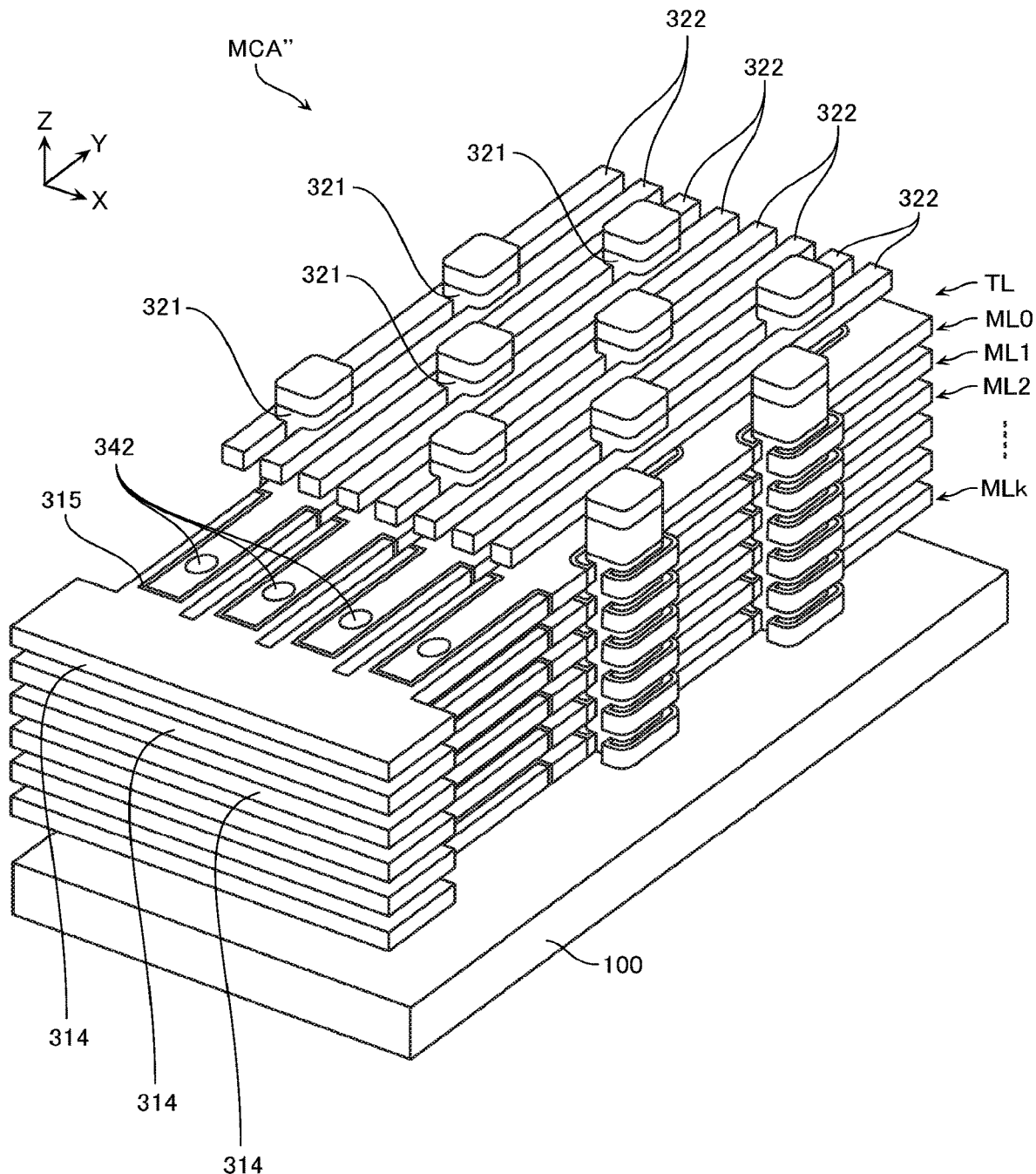
FIG. 28 is a schematic perspective view illustrating a configuration of a part of a semiconductor memory device according to another embodiment.
Figure 29:
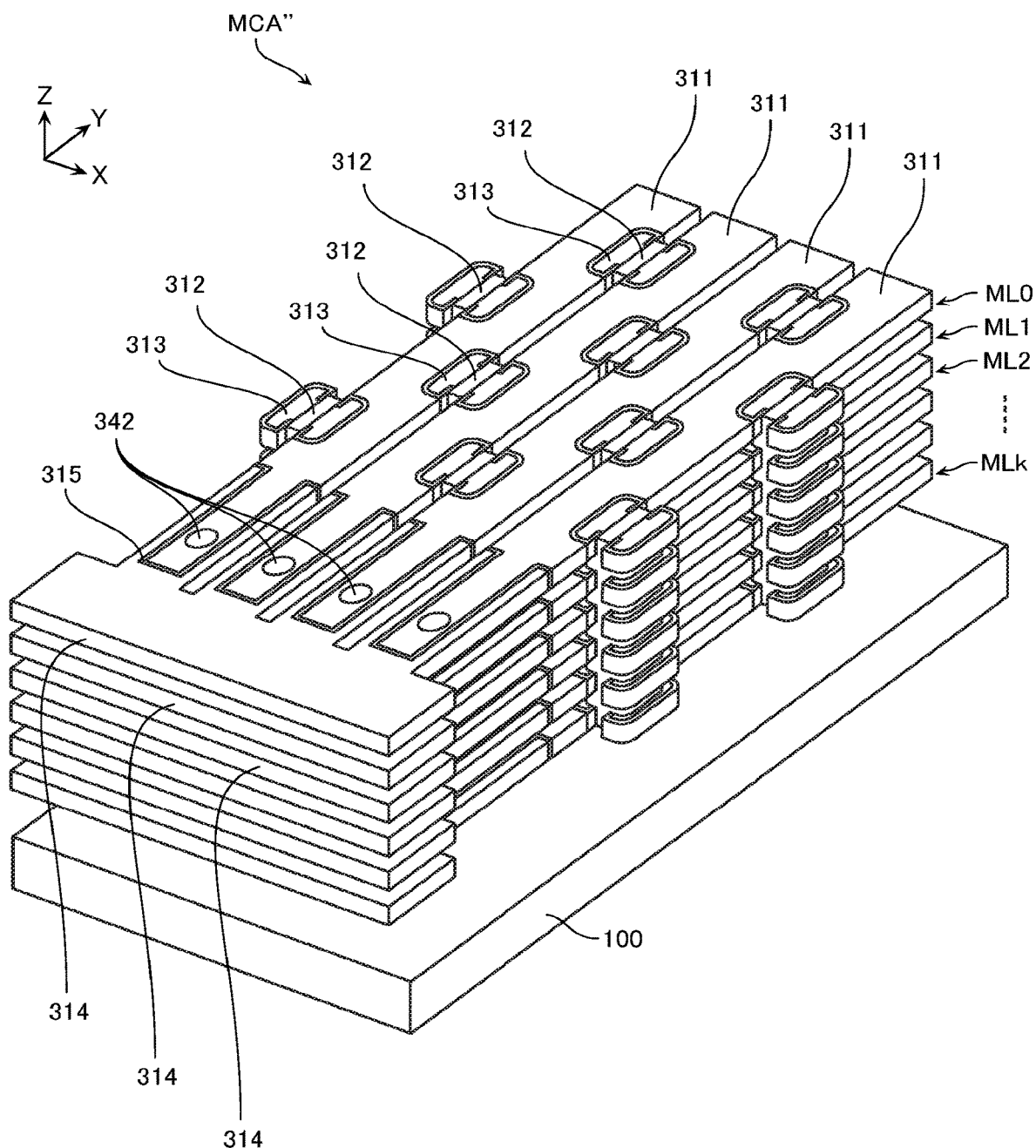
FIG. 29 is a schematic perspective view illustrating a configuration of a part of a semiconductor memory device according to another embodiment.

For example, the memory cell array MCA" exemplarily illustrated in FIG. 27 to FIG. 29 includes a plurality of memory layers ML0 to MLk arranged in the Z-direction, a transistor layer TL disposed above the plurality of memory layers ML0 to MLk, a word line layer WLL disposed above the transistor layer TL, and a bit line layer BLL disposed above the word line layer WLL. The following sequentially describes these configurations.

First, the memory layers ML0 to MLk will be described. The memory layers ML0 to MLk each includes, as illustrated in FIG. 29, a plurality of semiconductor layers 311 arranged in the X-direction and extending in the Y-direction, parts of a plurality of conductive layers 312 arranged in the Y-direction between two of the plurality of semiconductor layers 311, and gate insulating films 313 disposed between the semiconductor layers 311 and the conductive layers 312. The memory layers ML0 to MLk each includes a conductive layer 314 opposed to end portions of the plurality of semiconductor layers 311 in the Y-direction and gate insulating films 315 disposed between the semiconductor layers 311 and the conductive layer 314.

the semiconductor layer 311 includes, for example, polycrystalline silicon (Si) and the like. The semiconductor layer 311 has a side surface in the X-direction opposed to the plurality of conductive layers 312 and functioning as a channel region of the memory cell. One end portion of the semiconductor layer 311 in the Y-direction has both side surfaces in the X-direction and a side surface in the Y-direction opposed to the conductive layer 314 and functioning as a channel region of the select transistor. Note that the one end portion of the semiconductor layer 311 is connected to a conductive layer 342.

The conductive layer 312 includes, for example, a stacked film of titanium nitride (TiN) and tungsten (W) and the like. The conductive layer 312 has, for example, an approximately quadrangular prism shape. The conductive layer 312 extends in the Z-direction and functions as a local word line. The side surface of the conductive layer 312 in the X-direction is opposed to the side surfaces of the semiconductor layers 311 included in the memory layer ML0 to MLk, and functions as gate electrodes of the memory cell.

The gate insulating film 313 includes the ferroelectric film 131 and the insulating film 132, similarly to the gate insulating film 130 according to the first embodiment. The insulating film 132 is disposed between the ferroelectric film 131 and the semiconductor layer 311.

The conductive layer 314 includes, for example, a stacked film of titanium nitride (TiN) and tungsten (W) and the like. The conductive layer 314 has an approximately comb shape. The conductive layer 314 is opposed to the side surfaces of the end portions of the semiconductor layers 311 in the X-direction and functions as a gate electrode of the select transistor.

The gate insulating film 315 includes, for example, silicon oxide.

Next, the transistor layer TL will be described. The transistor layer TL includes, as illustrated in FIG. 28, a plurality of semiconductor layers 321 arranged in the X-direction and the Y-direction corresponding to the conductive layers 312 and a plurality of conductive layers 322 arranged in the X-direction and extending in the Y-direction and opposed to side surfaces atone side or the other side of the plurality of semiconductor layers 321 in the X-direction. Between the semiconductor layer 321 and the conductive layer 322, a gate insulating film (not illustrated), such as silicon oxide ($SiO_2$) is disposed.

The semiconductor layer 321 includes, for example, the polycrystalline silicon (Si). Both side surfaces of the semiconductor layer 321 in the X-direction are opposed to the conductive layers 322 and function as a channel region of the word line select transistor. The semiconductor layer 321 has a lower end connected to the conductive layer 312 (FIG. 29).

The conductive layer 322 includes, for example, a stacked film of titanium nitride (TiN) and tungsten (W) and the like. The conductive layer 322 extends in the Y-direction and functions as a word line select line. The conductive layer 322 is opposed to side surfaces of the plurality of semiconductor layers 321 in the X-direction and functions as gate electrodes of select transistors.

Next, the word line layer WLL will be described. The word line layer WLL includes, for example, a plurality of conductive layers 331 arranged in the Y-direction as illustrated in FIG. 27.

The conductive layer 331 includes, for example, a stacked film of titanium nitride (TiN) and tungsten (W) and the like. The conductive layer 331 extends in the X-direction and is connected to upper ends of the plurality of semiconductor layers 321 (FIG. 28) arranged in the X-direction in common. The conductive layers 331 each function as a global word line.

Next, the bit line layer BLL will be described. The bit line layer BLL includes, for example as illustrated in FIG. 27, a plurality of conductive layers 341 arranged in the X-direction and extending in the Y-direction.

The conductive layer 341 includes, for example, a stacked film of titanium nitride (TiN) and tungsten (W) and the like. The conductive layer 341 is connected to the semiconductor layers 311 of the memory layers ML0 to MLk via the conductive layer 342 extending in the Z-direction. The conductive layer 341 functions as a bit line BL. The conductive layer 342 functions as a bit line contact.

It is possible to execute the operation similar to those in each embodiment described above in the semiconductor memory device including such a memory cell array MCA".

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory transistor; and
a plurality of wirings connected to the memory transistor, wherein
the memory transistor includes:
a semiconductor layer;
a gate electrode opposed to the semiconductor layer; and
a gate insulating film disposed between the semiconductor layer and the gate electrode, wherein
the plurality of wirings include:
a first wiring connected to the semiconductor layer;
a second wiring connected to the semiconductor layer; and
a third wiring connected to the gate electrode, wherein
the gate insulating film includes oxygen (O) and hafnium (Hf) and has an orthorhombic crystalline structure, wherein
the semiconductor memory device is configured to execute a write operation, an erase operation, and a first read operation,
in the write operation, a write voltage in a first polarity is supplied between the third wiring and at least one of the first wiring or the second wiring,
in the erase operation, an erase voltage in a second polarity is supplied between the third wiring and at least one of the first wiring or the second wiring, the second polarity being different from the first polarity,
in the first read operation, the write voltage or a voltage having a larger amplitude than an amplitude of the write voltage in the first polarity is supplied between the third wiring and at least one of the first wiring or the second wiring.

2. The semiconductor memory device according to claim 1, wherein
the semiconductor memory device is configured to be able to execute the erase operation on the memory transistor after a first execution of the first read operation and before a second execution of the first read operation in a case where the first read operation is executed on the memory transistor twice.

3. The semiconductor memory device according to claim 1, wherein
the semiconductor memory device is configured to execute a second read operation,
in the second read operation,
a first read voltage is supplied between the first wiring and the second wiring, the first read voltage having an amplitude smaller than amplitudes of the write voltage and the erase voltage,
a second read voltage is supplied between the first wiring and the third wiring, the second read voltage having an amplitude smaller than amplitudes of the write voltage and the erase voltage.

4. The semiconductor memory device according to claim 3, wherein
an operating condition under which the first read operation is executed in response to input of a command of executing a read operation is assumed to be a first operating condition, and
an operating condition under which the second read operation is executed in response to input of the command of executing the read operation is assumed to be a second operating condition,
the operating conditions are switched from the second operating condition to the first operating condition corresponding to an increase in count of execution of the write operation or the erase operation.

5. The semiconductor memory device according to claim 4, wherein
the semiconductor memory device operates under the second operating condition until the count of execution of the write operation or the erase operation reaches a predetermined count, and
the semiconductor memory device operates under the first operating condition after the count of execution of the write operation or the erase operation has reached the predetermined count.

6. The semiconductor memory device according to claim 4, wherein
the semiconductor memory device is configured to execute a first operation including a third read operation and a fourth read operation,
in the third read operation:
the first read voltage is supplied between the first wiring and the second wiring, and
a third read voltage is supplied between the first wiring and the third wiring, the third read voltage having an amplitude smaller than amplitudes of the write voltage and the erase voltage, in the fourth read operation:
the first read voltage is supplied between the first wiring and the second wiring,
a fourth read voltage is supplied between the first wiring and the third wiring, the fourth read voltage having an amplitude smaller than amplitudes of the write voltage and the erase voltage, the fourth read voltage being different from the third read voltage,
the semiconductor memory device operates under the second operating condition before an execution of the first operation, and
the semiconductor memory device operates under the first operating condition after the execution of the first operation.

7. The semiconductor memory device according to claim 1, wherein
the semiconductor memory device is configured to execute a first operation including a third read operation and a fourth read operation,
in the third read operation:
a first read voltage is supplied between the first wiring and the second wiring, the first read voltage having an amplitude smaller than amplitudes of the write voltage and the erase voltage, and
a third read voltage is supplied between the first wiring and the third wiring, the third read voltage having an amplitude smaller than amplitudes of the write voltage and the erase voltage,
in the fourth read operation,
the first read voltage is supplied between the first wiring and the second wiring,
a fourth read voltage is supplied between the first wiring and the third wiring, the fourth read voltage having an amplitude smaller than amplitudes of the write voltage and the erase voltage, the fourth read voltage being different from the third read voltage, and
the first operation is executed before an execution of the first read operation.

8. A semiconductor memory device comprising:
a memory transistor; and
a plurality of wirings connected to the memory transistor, wherein
the memory transistor includes:
a semiconductor layer;
a gate electrode opposed to the semiconductor layer; and
a gate insulating film disposed between the semiconductor layer and the gate electrode, wherein
the plurality of wirings include:
a first wiring connected to the semiconductor layer;
a second wiring connected to the semiconductor layer; and
a third wiring connected to the gate electrode, wherein
the gate insulating film includes oxygen (O) and hafnium (Hf) and has an orthorhombic crystalline structure, wherein
the semiconductor memory device is configured to execute a write operation, an erase operation, and a first read operation,
in the write operation, a write voltage in a first polarity is supplied between the third wiring and at least one of the first wiring or the second wiring,
in the erase operation, an erase voltage in a second polarity is supplied between the third wiring and at least one of the first wiring or the second wiring, the second polarity being different from the first polarity,
in the first read operation, the erase voltage or a voltage having a larger amplitude than an amplitude of the erase voltage in the second polarity is supplied between the third wiring and at least one of the first wiring or the second wiring.

9. The semiconductor memory device according to claim 8, wherein
the semiconductor memory device is configured to be able to execute the write operation on the memory transistor after a first execution of the first read operation and before a second execution of the first read operation in a case where the first read operation is executed on the memory transistor twice.

10. The semiconductor memory device according to claim 8, wherein
the semiconductor memory device is configured to execute a second read operation,
in the second read operation,
a first read voltage is supplied between the first wiring and the second wiring, the first read voltage having an amplitude smaller than amplitudes of the write voltage and the erase voltage,
a second read voltage is supplied between the first wiring and the third wiring, the second read voltage having an amplitude smaller than amplitudes of the write voltage and the erase voltage.

11. The semiconductor memory device according to claim 10, wherein
an operating condition under which the first read operation is executed in response to input of a command of executing a read operation is assumed to be a first operating condition, and
an operating condition under which the second read operation is executed in response to input of the command of executing the read operation is assumed to be a second operating condition,
the operating conditions are switched from the second operating condition to the first operating condition corresponding to an increase in count of execution of the write operation or the erase operation.

12. The semiconductor memory device according to claim 11, wherein
the semiconductor memory device operates under the second operating condition until the count of execution of the write operation or the erase operation reaches a predetermined count, and
the semiconductor memory device operates under the first operating condition after the count of execution of the write operation or the erase operation has reached the predetermined count.

13. The semiconductor memory device according to claim 11, wherein
the semiconductor memory device is configured to execute a first operation including a third read operation and a fourth read operation,
in the third read operation:
the first read voltage is supplied between the first wiring and the second wiring, and
a third read voltage is supplied between the first wiring and the third wiring, the third read voltage having an amplitude smaller than amplitudes of the write voltage and the erase voltage,
in the fourth read operation:
the first read voltage is supplied between the first wiring and the second wiring,
a fourth read voltage is supplied between the first wiring and the third wiring, the fourth read voltage having an amplitude smaller than amplitudes of the write voltage and the erase voltage, the fourth read voltage being different from the third read voltage, the semiconductor memory device operates under the second operating condition before an execution of the first operation, and the semiconductor memory device operates under the first operating condition after the execution of the first operation.

14. The semiconductor memory device according to claim 8, wherein the semiconductor memory device is configured to execute a first operation including a third read operation and a fourth read operation, in the third read operation:

a first read voltage is supplied between the first wiring and the second wiring, the first read voltage having an amplitude smaller than amplitudes of the write voltage and the erase voltage, and a third read voltage is supplied between the first wiring and the third wiring, the third read voltage having an amplitude smaller than amplitudes of the write voltage and the erase voltage, in the fourth read operation, the first read voltage is supplied between the first wiring and the second wiring, a fourth read voltage is supplied between the first wiring and the third wiring, the fourth read voltage having an amplitude smaller than amplitudes of the write voltage and the erase voltage, the fourth read voltage being different from the third read voltage, and the first operation is executed before an execution of the first read operation.

* * * * *